US012793944B2

(12) United States Patent
Wang et al.

(10) Patent No.: US 12,793,944 B2
(45) Date of Patent: Nov. 10, 2026

(54) GAS DISTRIBUTION RING FOR PROCESS CHAMBER

(71) Applicant: Taiwan Semiconductor Manufacturing Company, Ltd., Hsinchu (TW)

(72) Inventors: Po-Hsiang Wang, New Taipei City (TW); Min-Chang Ching, Zhubei City (TW); Kuo Liang Lu, Hsinchu City (TW); Bo-Han Chu, Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 192 days.

(21) Appl. No.: 18/780,815

(22) Filed: Jul. 23, 2024

(65) Prior Publication Data

US 2024/0379330 A1 Nov. 14, 2024

Related U.S. Application Data

(62) Division of application No. 17/851,385, filed on Jun. 28, 2022, now Pat. No. 12,243,719.

(51) Int. Cl.
*B32B 18/00* (2006.01)
*B32B 3/26* (2006.01)
(Continued)

(52) U.S. Cl.
CPC .......... *H01J 37/3244* (2013.01); *B32B 3/266* (2013.01); *B32B 3/30* (2013.01);
(Continued)

(58) Field of Classification Search
CPC .......... B32B 3/263; B32B 3/266; B32B 3/30; B32B 18/00; C23C 16/455;
(Continued)

(56) References Cited

U.S. PATENT DOCUMENTS

2004/0099378 A1 5/2004 Kim et al.
2008/0223873 A1 9/2008 Chen et al.
(Continued)

OTHER PUBLICATIONS

Notice of Allowance dated Nov. 7, 2024 for U.S. Appl. No. 17/851,385.
Non-Final Office Action dated Jul. 22, 2024 for U.S. Appl. No. 17/851,385.

*Primary Examiner* — Michael A Tolin
(74) *Attorney, Agent, or Firm* — Eschweiler & Potashnik, LLC

(57) ABSTRACT

The present disclosure relates to an integrated chip processing tool. The integrated chip processing tool includes a gas distribution ring configured to extend along a perimeter of a process chamber. The gas distribution ring includes a lower ring extending around the process chamber. The lower ring has a plurality of gas inlets arranged along a bottom surface of the lower ring and a plurality of gas conveyance channels arranged along an upper surface of the lower ring directly over the plurality of gas inlets. The gas distribution ring further includes an upper ring disposed on the upper surface of the lower ring and covering the plurality of gas conveyance channels. A plurality of gas outlets are arranged along opposing ends of the plurality of gas conveyance channels. A plurality of gas conveyance paths extending between the plurality of gas inlets and the plurality of gas outlets have approximately equal lengths.

20 Claims, 18 Drawing Sheets

(51) Int. Cl.

| | |
|---|---|
| ***B32B 3/30*** | (2006.01) |
| ***C23C 16/455*** | (2006.01) |
| ***H01J 37/32*** | (2006.01) |

(52) U.S. Cl.
CPC .......... *B32B 18/00* (2013.01); *C23C 16/4558* (2013.01); *H01J 37/32495* (2013.01); *H01J 2237/006* (2013.01); *H01J 2237/0203* (2013.01); *H01J 2237/0268* (2013.01)

(58) Field of Classification Search
CPC ........... C23C 16/45563; C23C 16/4558; H01J 37/32431; H01J 37/3244; H01J 37/32449; H01J 37/32458; H01J 37/32467; H01J 37/32477; H01J 37/32495; H01J 37/23513; H01J 2237/006; H01J 2237/02; H01J 2237/0203; H01J 2237/0213; H01J 2237/026; H01J 2237/0268
See application file for complete search history.

(56) References Cited

U.S. PATENT DOCUMENTS

| | | | | |
|---|---|---|---|---|
| 2009/0057269 | A1 | 3/2009 | Katz et al. | |
| 2010/0252197 | A1* | 10/2010 | Kadkhodayan ..... | H01J 37/3255 156/345.34 |
| 2020/0381213 | A1 | 12/2020 | Lian et al. | |
| 2021/0151294 | A1 | 5/2021 | Su et al. | |

* cited by examiner

GAS DISTRIBUTION RING FOR PROCESS CHAMBER

REFERENCE TO RELATED APPLICATION

This Application is a Divisional of U.S. application Ser. No. 17/851,385, filed on Jun. 28, 2022, the contents of which are hereby incorporated by reference in their entirety.

BACKGROUND

Plasma processes (e.g., plasma etching and/or plasma deposition processes) are widely used during the fabrication of integrated chips. Typically, in a plasma process charged ions are accelerated towards a substrate to deposit a material and/or etch a material away from the substrate. Plasma processes are able to offer a number of advantages over non-plasma processes such as improved dimensional tolerances, high purity, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
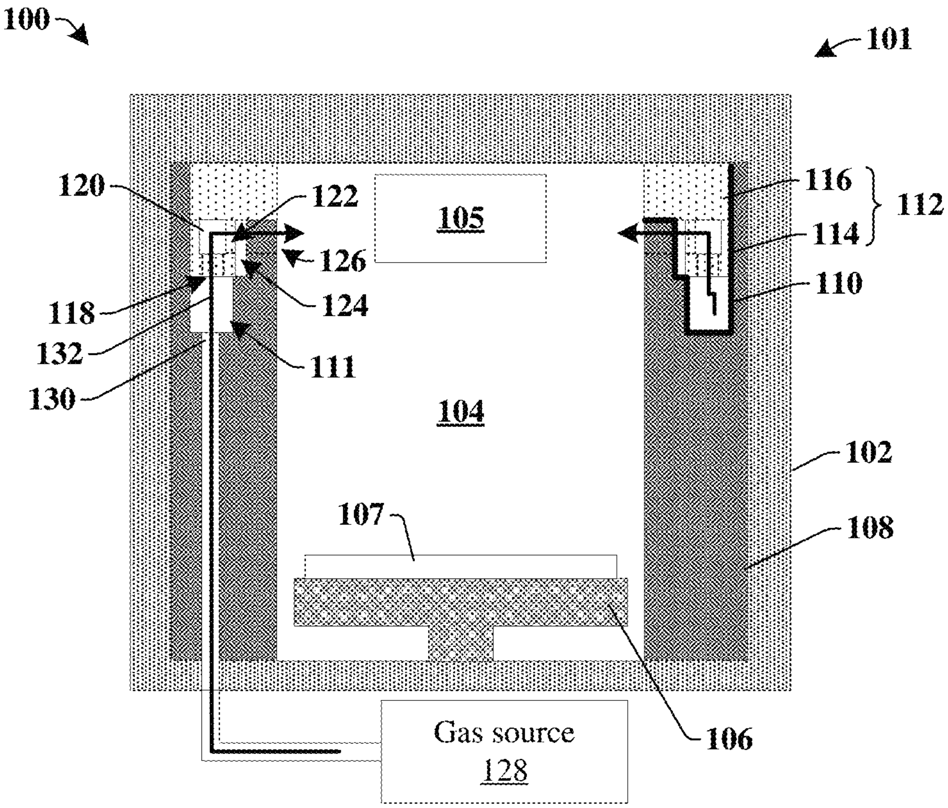
FIGS. 1A-1C illustrate some embodiments of an integrated chip processing tool having a gas distribution ring arranged within a shielding inset.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In integrated chip applications, process chambers are used in many deposition and etching processes. Process chambers are enclosed chambers that allow for processes to be performed at low pressures that reduce contamination of a substrate being operated upon. Many deposition and etching processes are performed within a process chamber using a plasma. The plasma may be generated by acting upon gas particles with an electric field. The electric field transfers energy to the gas particles, so as to free electrons from the gas particles and generate a plasma comprising an ionized gas of charged particles.

During operation of a plasma processing tool, charged particles from a plasma may collide with one or more sidewalls of a process chamber. The repeated collision between the charged particles and the one or more sidewalls may cause damage to the process chamber over time. To prevent such damage, a shielding inset may be placed within the process chamber. The shielding inset comprises a metal tube that covers the one or more sidewalls of the process chamber. A ceramic ring is disposed within a groove along a top of the shielding inset. The ceramic ring may contact the shielding inset and a roof of the process chamber to block gases from moving past the top of the shielding inset.

The shielding inset may be arranged over a gas pipe, which is configured to provide a process gas to process chamber, in a manner that causes the gas pipe to provide the process gas to a lower portion of the groove extending in a closed loop below the ceramic ring. The process gas goes from the lower portion of the groove to a central region of the process chamber through gas vents extending between the groove and an interior sidewall of the shielding inset. However, it has been appreciated that such gas vents do not provide for an even flow rate of the process gas since the gas vents are arranged at different distances from the gas pipe. For example, gas vents that are closer to the gas pipe will have a higher flow rate than gas vents that are further from the gas pipe. The uneven flow rates of the process gas can lead to an uneven deposition of a material on a substrate, thereby degrading a process window the tool. Furthermore, over time the uneven flow rates of the process gas can lead to peeling between different parts of the shielding inset that meet along an interface to form the gas vents. The peeling can increase a size of some of the gas vents thereby increasing inequities in gas flow rates and leading to reliability problems.

The present disclosure relates to a shielding inset and gas distribution ring that are configured to provide for even gas flow rates at gas vents extending between a gas pipe and a central region of a process chamber. The shielding inset comprises a tube that is configured to cover one or more sidewalls of a process chamber. The shielding inset has surfaces defining a groove disposed along an upper surface of the shielding inset. The groove is in communication with a gas pipe configured to provide a process gas. A gas distribution ring is disposed within the groove. The gas distribution ring has a plurality of gas inlets disposed within a bottom surface of the gas distribution ring. The plurality of gas inlets are coupled to a plurality of gas outlets by a plurality of gas conveyance channels. The gas outlets are configured to provide a process gas to a plurality of gas vents arranged between the shielding inset and the gas distribution ring. The gas conveyance channels are configured to provide for approximately equal path lengths between the gas pipe and the plurality of gas vents. The approximately equal path lengths cause gas flow rates at different ones of the plurality of gas vents to be approximately equal to one another, thereby improving a process window of a plasma processing tool.

FIG. 1A illustrates a block diagram of some embodiments of an integrated chip processing tool 100 comprising a gas distribution ring disposed within a shield inset.

The integrated chip processing tool 100 comprises a process chamber 101 having a housing 102. In some embodiments, a substrate chuck 106 configured to receive a substrate 107 is disposed within the process chamber 101. In some embodiments, a plasma generator 105 is in communication with the process chamber 101. The plasma generator 105 may comprise one or more electrodes (e.g., antenna) coupled to a power source (e.g., a radio frequency (RF) power source). The one or more electrodes are configured to generate a magnetic field and/or an electric field that transfers energy from the power source to gas particles within the process chamber to form a plasma within the process chamber 101. In some embodiments, the plasma generator 105 may be disposed within the process chamber 101, while in other embodiments the plasma generator 105 may comprise a remote plasma generator located upstream of the process chamber 101.

A shielding inset 108 is arranged within the process chamber 101 between the substrate chuck 106 and one or more sidewalls of the process chamber 101. The shielding inset 108 is configured to cover the one or more sidewalls of the process chamber 101, so as to protect the one or more sidewalls from damage that may occur during plasma processes performed within the process chamber 101. The shielding inset 108 comprises a tube that wraps around a central region 104 of the process chamber 101. The shielding inset 108 comprises surfaces defining a groove 110 disposed along an upper surface of the shielding inset 108. The groove 110 is in communication with a gas source 128 by way of a gas pipe 130 configured to provide a process gas.

A gas distribution ring 112 is disposed within the groove 110. In some embodiments, the gas distribution ring 112 rests on a horizontally extending surface of the shielding inset 108 so as to form a lower channel 111 extending within the shielding inset 108 below the gas distribution ring 112. The lower channel 111 is coupled to the gas pipe 130. The gas distribution ring 112 comprises a lower ring 114 and an upper ring 116 disposed over the lower ring 114. A plurality of gas inlets 118 are arranged along a bottom surface of the lower ring 114. A plurality of gas conveyance channels 120 are arranged along an upper surface of the lower ring 114. The plurality of gas conveyance channels 120 are configured to transfer a process gas from the plurality of gas inlets 118 to a plurality of gas outlets 122 arranged within one or more interior sidewalls of the lower ring 114. The plurality of gas outlets 122 are in communication with an upper channel 124 arranged laterally between the one or more interior sidewalls of the lower ring 114 and the shielding inset 108. The upper channel 124 connects the plurality of gas outlets 122 to a plurality of gas vents 126 configured to allow the process gas to exit from the gas distribution ring 112 to the central region 104 of the shielding inset 108. In some embodiments, the plurality of gas vents 126 are arranged vertically between the shielding inset 108 and the gas distribution ring 112.

Figure 1B:
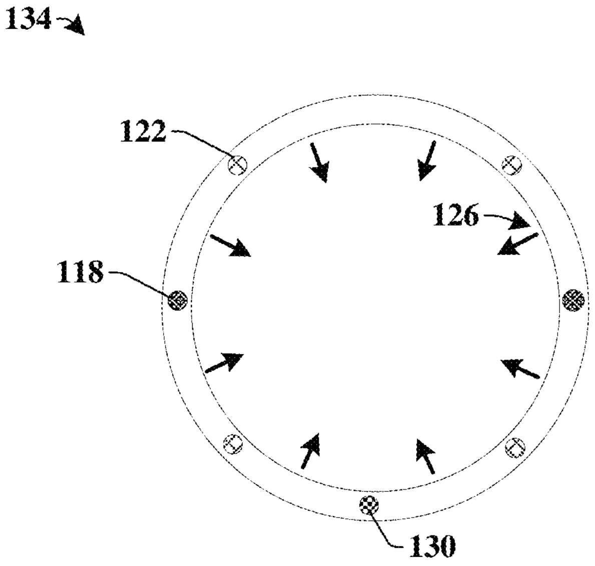

FIG. 1B illustrates some embodiments of a diagram of a top-view 134 of the shielding inset 108 and the gas distribution ring 112 shown in FIG. 1A. The top-view 134 illustrates the locations of the gas pipe 130, the plurality of gas inlets 118, the plurality of gas outlets 122, and the plurality of gas vents 126.

Figure 1C:
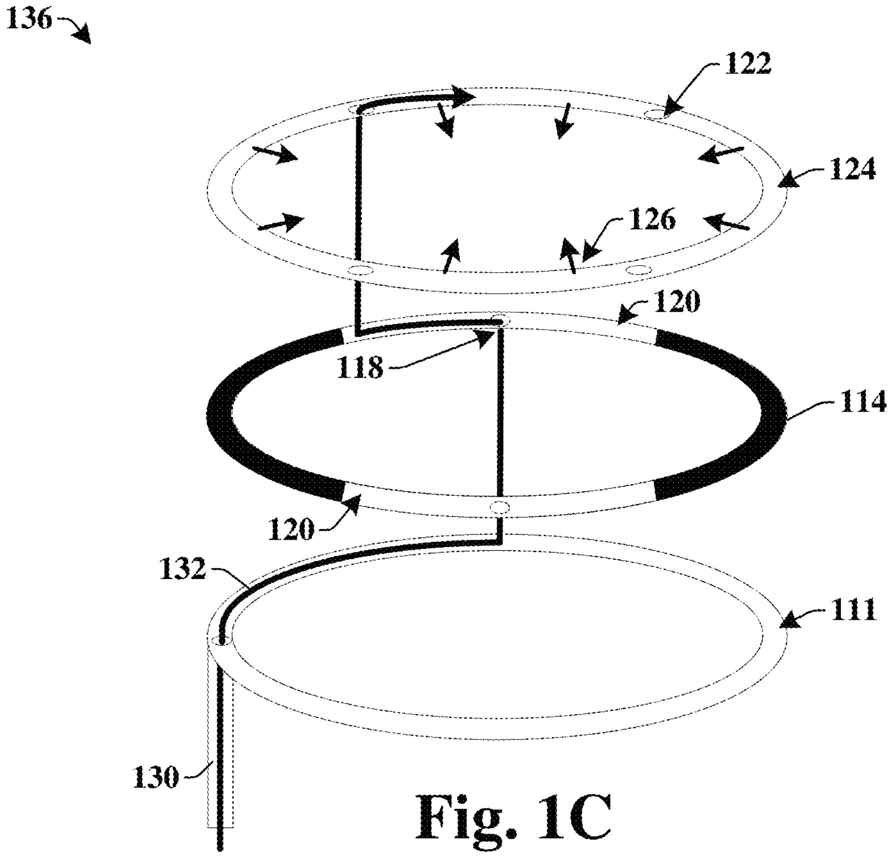

FIG. 1C illustrates some embodiments of a three-dimensional diagram 136 showing an exemplary gas conveyance path through a disclosed gas distribution ring.

As shown in three-dimensional diagram 136, the lower channel 111 extends in a closed loop extending around the central region of the process chamber. The lower channel 111 is in communication with the gas pipe 130, which is configured to provide the process gas to the lower channel 111. The lower ring 114 of the gas distribution ring 112 is disposed over the lower channel 111.

The plurality of gas inlets 118 are arranged within the bottom surface of the lower ring 114. The plurality of gas inlets 118 are in communication with the plurality of gas conveyance channels 120, which extend through the lower ring 114. The plurality of gas conveyance channels 120 respectively extend from the plurality of gas inlets 118 to the plurality of gas outlets 122, which are arranged at opposing ends of a gas conveyance channel. The plurality of gas conveyance channels 120 terminate at the plurality of gas outlets 122. For example, a first gas conveyance channel may extend between a first gas outlet and a second gas outlet disposed at opposing ends of the first gas conveyance channel. The plurality of gas outlets 122 are in communication with the upper channel 124, which extends around the shielding inset in a closed loop. The plurality of gas outlets 122 are in communication with the upper channel 124. The plurality of gas vents 126 are arranged between the upper channel 124 and a central region of the process chamber. The plurality of gas vents 126 are configured to provide the process gas from the upper channel 124 to within the central region of the process chamber.

In some embodiments, the plurality of gas inlets 118 are arranged at approximately equal distances from the gas pipe 130, the plurality of gas outlets are arranged at approximately equal distances from a gas inlet, and the plurality of gas vents 126 are arranged at approximately equal distances from a gas outlet. In some embodiments, the plurality of gas inlets 118 may comprise two gas inlets, the plurality of gas conveyance channels 120 may comprise two gas conveyance channels respectively in communication with one of the two gas inlets, the plurality of gas outlets 122 may comprise four gas outlets respectively arranged at opposing ends of the two gas conveyance channels, and the plurality of gas vents may comprise eight gas vents.

A plurality of gas conveyance paths 132 extend between the gas pipe 130 and the plurality of gas vents 126. The plurality of gas conveyance paths 132 have lengths that are substantially equal to one another. The equal lengths of plurality of gas conveyance paths 132 cause gas flow rates at different ones of the plurality of gas vents 126 to be approximately equal to one another. The substantially equal gas flow rates result in a uniform etching rate and/or deposition of a material onto a substrate. The substantially equal flow can also reduce a stress upon a deposited film so as to improve deposition quality. Furthermore, the substantially equal gas flow rates may also prevent peeling between the shielding inset and the gas distribution ring, thereby improving a lifetime of a processing tool.

Figure 2A:
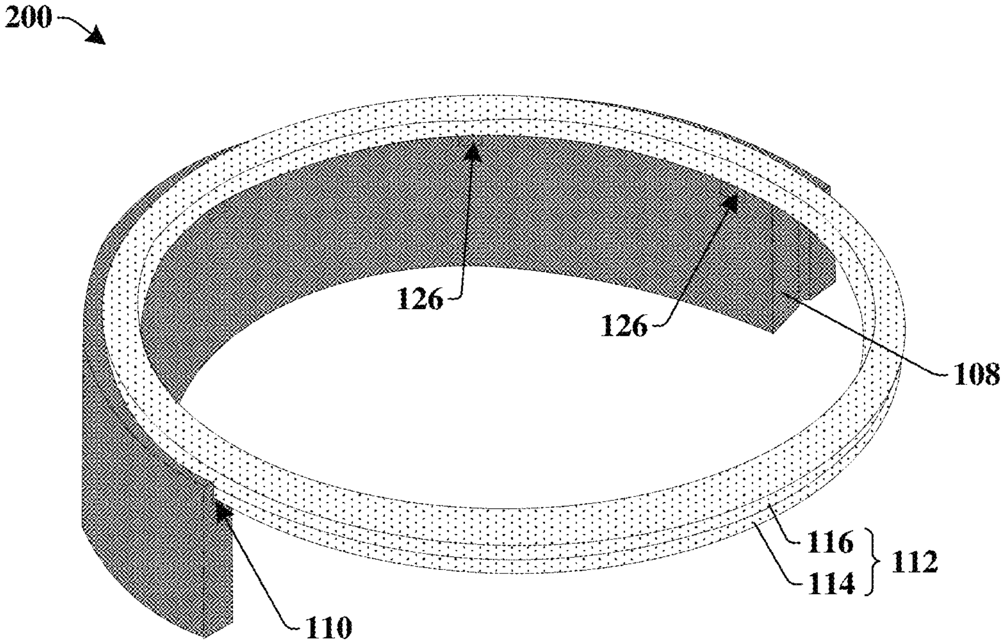
FIGS. 2A-2C illustrate three-dimensional cut-away views of some additional embodiments of a gas distribution ring arranged within a shielding inset.

FIG. 2A illustrates some embodiments of a three-dimensional cut-away view 200 showing parts of a shielding inset and a disclosed gas distribution ring.

As shown in three-dimensional cut-away view 200, a shielding inset 108 comprises a cylindrical shape that extends in a closed loop. A groove 110 is arranged within an upper surface of the shielding inset 108. The groove 110 also extends in a closed loop. A gas distribution ring 112 is arranged within the groove 110. The gas distribution ring 112 comprises a lower ring 114 and an upper ring 116. The lower ring 114 is arranged within the groove 110 and the upper ring 116 rests on an upper surface of the lower ring 114 and an upper surface of the shielding inset 108. A plurality of gas vents 126 are arranged between the shielding inset 108 and the upper ring 116. In some embodiments, the plurality of gas vents 126 may be formed by a horizontally extending surface and sidewalls of the shielding inset 108 and by a lower surface of the upper ring 116.

Figure 2B:
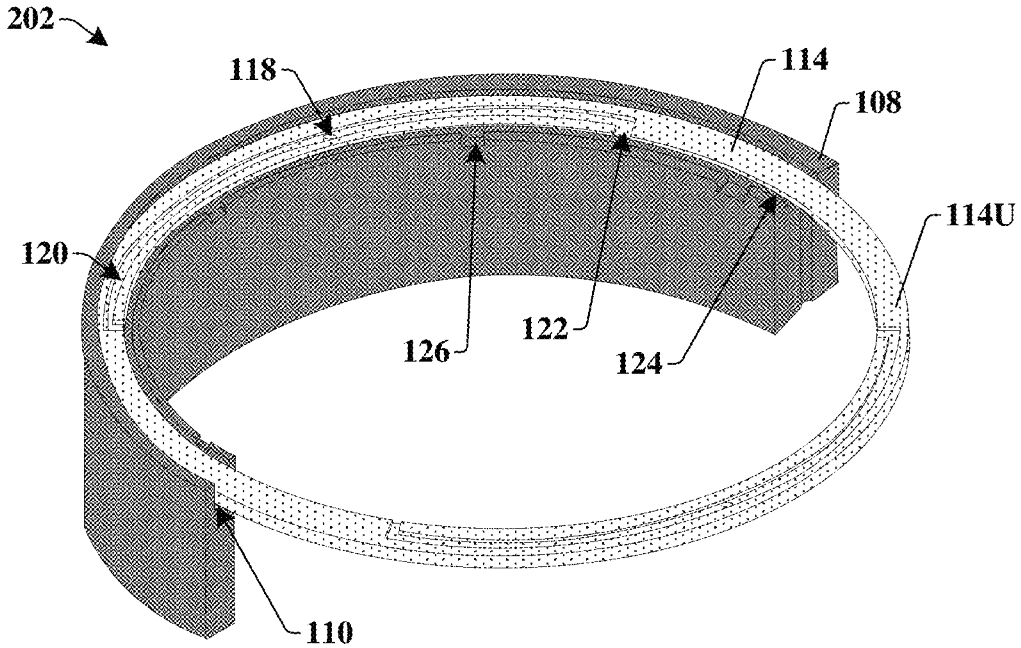

FIG. 2B illustrates some additional embodiments of a three-dimensional cut-away view 202 showing parts of a shielding inset and a lower ring of the disclosed gas distribution ring.

As shown in three-dimensional cut-away view 202, the lower ring 114 of the gas distribution ring 112 is arranged within the groove 110. A gas conveyance channel 120 is arranged within an upper surface 114U of the lower ring 114. The gas conveyance channel 120 comprises a recess (e.g., depression) in the upper surface 114U of the lower ring 114). In some embodiments, the gas conveyance channel 120 extends in an angular direction (e.g., that wraps around a point at a center of the lower ring 114) and in a radial direction (e.g., that is extends outward from the point at the center of the lower ring 114). A gas inlet 118 extends from a bottom surface of the lower ring 114 to the gas conveyance channel 120. The gas conveyance channel 120 is further coupled to a gas outlet 122 between the gas conveyance channel 120 and an upper channel 124 that is laterally between the lower ring 114 and the shielding inset 108. The one or more gas vents 126 are arranged within a sidewall of the shielding inset 108. The one or more gas vents 126 couple the upper channel 124 to a central region of the shielding inset 108.

Figure 2C:
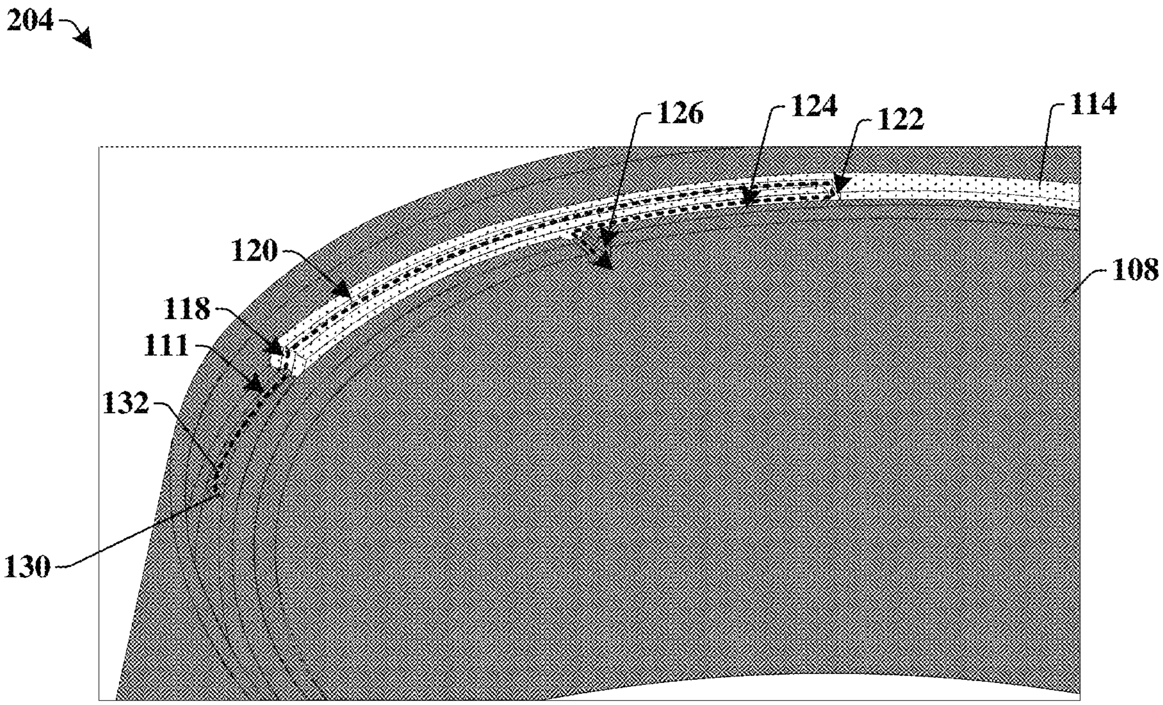

FIG. 2C illustrates some additional embodiments of a three-dimensional cut-away view 204 showing parts of a shielding inset and a lower ring of the disclosed gas distribution ring.

As shown in three-dimensional cut-away view 204, the lower ring 114 sits on one or more horizontally extending surfaces of the shielding inset 108 so that a lower channel 111 is arranged below the lower ring 114. The lower channel 111 is in communication with a gas pipe 130 configured to provide a process gas. During operation, the process gas flows along a gas conveyance path 132 that extends from within the lower channel 111 to the plurality of gas inlets 118 arranged within the bottom surface of the lower ring 114. The plurality of gas inlets 118 allows for the process gas to flow from the lower channel 111 to the plurality of gas conveyance channels 120 within the lower ring 114. The plurality of gas conveyance channels 120 provide the process gas to the upper channel 124, which provides the process gas to the one or more gas vents 126.

Figure 3A:
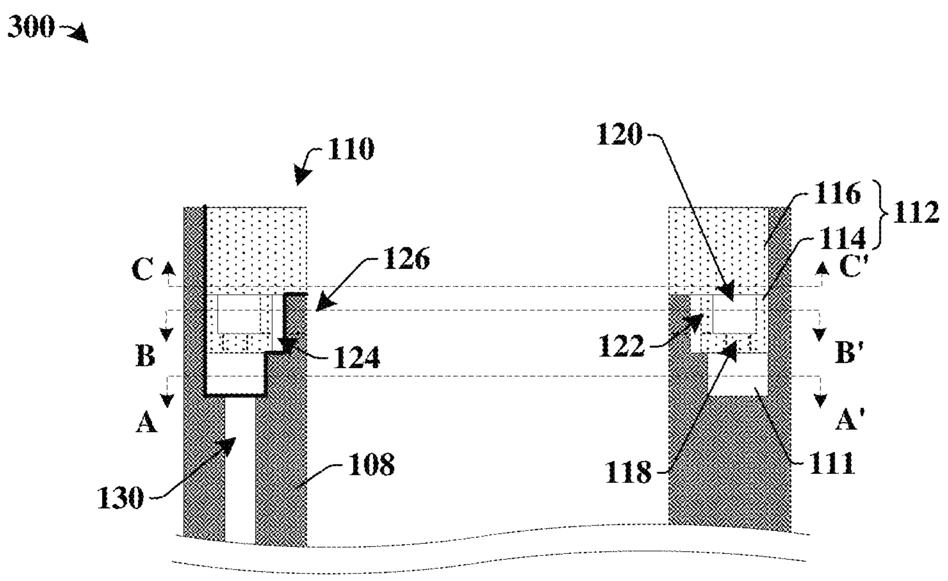
FIGS. 3A-3D illustrate some additional embodiments of a gas distribution ring arranged within a shielding inset.

FIG. 3A illustrates a cross-sectional view 300 of some additional embodiments of a disclosed gas distribution ring disposed within a shielding inset.

As shown in cross-sectional view 300, a shielding inset 108 comprises surfaces defining a groove 110 arranged within an upper surface of the shielding inset 108. In some embodiments, the groove 110 may comprise a stair-step profile comprising horizontally extending surfaces and vertically extending surfaces. The stair-step profile causes the groove 110 to have a plurality of different widths.

A gas distribution ring 112 is arranged within the groove 110. In some embodiments, the gas distribution ring 112 may comprise or be a ceramic (e.g., alumina, yttria, or the like). The gas distribution ring 112 comprises a lower ring 114 and an upper ring 116 arranged on the lower ring 114. The gas distribution ring 112 has a bottom surface that rests on one or more horizontally extending surfaces of the shielding inset 108. The bottom surface of the gas distribution ring 112 extends from over the one or more horizontally extending surfaces to over a lower channel 111 defined by a portion of the groove 110 that is below the bottom surface of the gas distribution ring 112. The lower channel 111 extends around the shielding inset 108 in a closed and unbroken loop. The lower channel 111 is in communication with a plurality of gas inlets 118 disposed within the bottom surface of the lower ring 114. The plurality of gas inlets 118 extend from the lower channel to a plurality of gas conveyance channels 120 disposed along an upper surface of the lower ring 114.

One or more sidewalls of the lower ring 114 are laterally separated from one or more sidewalls of the shielding inset 108 to form an upper channel 124 that extends around the shielding inset 108 in a closed and unbroken loop. The plurality of gas conveyance channels 120 are coupled to the upper channel 124 by way of a plurality of gas outlets 122 arranged within the one or more interior sidewalls of the lower ring 114. The upper channel 124 is further connected to a central region of the shielding inset 108 by way of gas vents 126 disposed vertically between the shielding inset 108 and the upper ring 116.

Figure 3B:
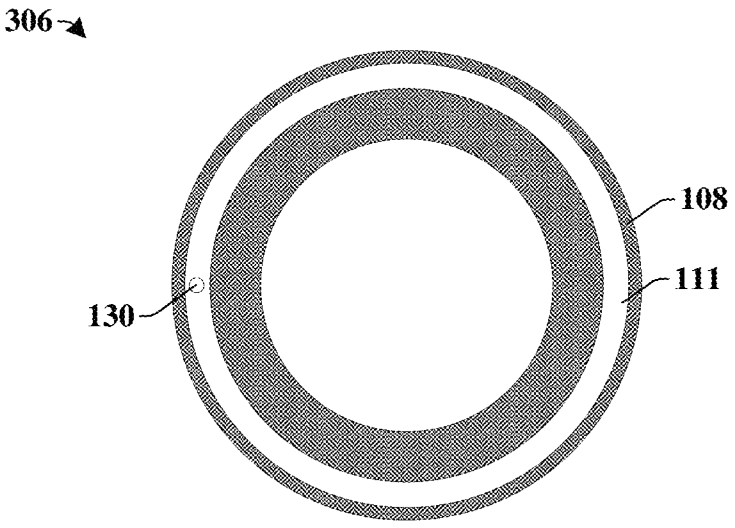

FIG. 3B illustrates some embodiments of a top-view 306 taken along cross-sectional line A-A' of FIG. 3A.

As shown in top-view 306, the lower channel 111 is disposed directly over a gas pipe 130 that is configured to provide a process gas to the lower channel 111. The lower channel 111 extends in a closed loop surrounding the central region of the shielding inset 108.

Figure 3C:
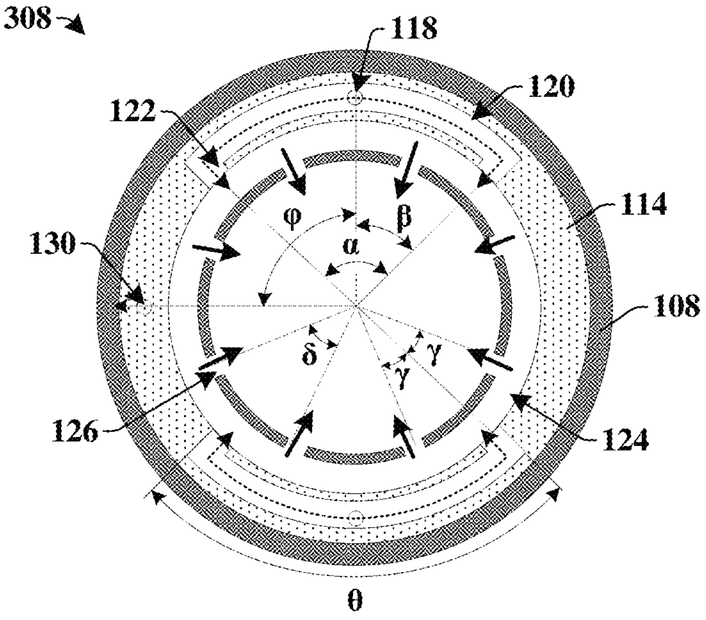

FIG. 3C illustrates some embodiments of a top-view 308 taken along cross-sectional line B-B' of FIG. 3A.

As shown in top-view 308, a plurality of gas conveyance channels 120 are respectively disposed over one of a plurality of gas inlets 118. The plurality of gas inlets 118 allow for the process gas to flow from the lower channel (111 of FIG. 3B) to the plurality of gas conveyance channels 120. In some embodiments, the plurality of gas conveyance channels 120 may respectively be centered over one of the plurality of gas inlets 118. In such embodiments, a gas conveyance channel extends to substantially equal distances past the one of the plurality of gas inlets 118. In some embodiments, the plurality of gas conveyance channels 120 may respectively extend over an arc spanning a first angle θ measured along a circle concentric with the shielding inset 108. In some embodiments, the first angle θ may be less than approximately 180°, less than approximately 120°, between approximately 90° and approximately 100°, approximately 90°, or other similar values. In some embodiments, the plurality of gas inlets 118 may be arranged at approximately equal distances from the gas pipe 130. In some embodiments, the plurality gas inlets 118 may arranged at a second angle φ from the gas pipe 130 as measured along a circle concentric with the shielding inset 108. In some embodiments, the second angle φ may be approximately equal to 180°.

A plurality of gas outlets 122 are arranged at each end of the plurality of gas conveyance channels 120. The plurality of gas outlets 122 allow for gas to travel from the plurality of gas conveyance channels 120 to an upper channel 124 that is laterally between the lower ring 114 and the shielding inset 108. Because plurality of gas conveyance channels 120 extend to equal distances past the one of the plurality of gas inlets 118, the plurality of gas outlets 122 are arranged at equal distances from the one of the plurality of gas inlets 118. In some embodiments, centers of the plurality of gas outlets 122 are separated by a third angle α measured along a circle concentric with the shielding inset 108. In some embodiments, the third angle α may be less than approximately 180°, less than approximately 120°, approximately 90°, or other similar values.

The upper channel 124 wraps around the central region of the shielding inset 108 in a closed and unbroken loop. A plurality of gas vents 126 are arranged in sidewalls of the shielding inset 108 between the upper channel 124 and the central region. The plurality of gas vents 126 are arranged at substantially equal distances from a closest one of the plurality of gas outlets 122. In some embodiments, the plurality of gas vents 126 may be separated from a closest one of the plurality of gas outlets 122 by a fourth angle γ measured along a circle that is centered upon a center of the shielding inset 108. In some embodiments, the fourth angle γ may be equal to approximately 22.5°. The plurality of gas vents 126 are arranged at substantially equal distances from one another. In some embodiments, the plurality of gas vents 126 may be separated from one another by a fifth angle δ measured along a circle that is centered upon a center of the shielding inset 108. In some embodiments, the fifth angle δ may be equal to approximately 45°.

Figure 3D:
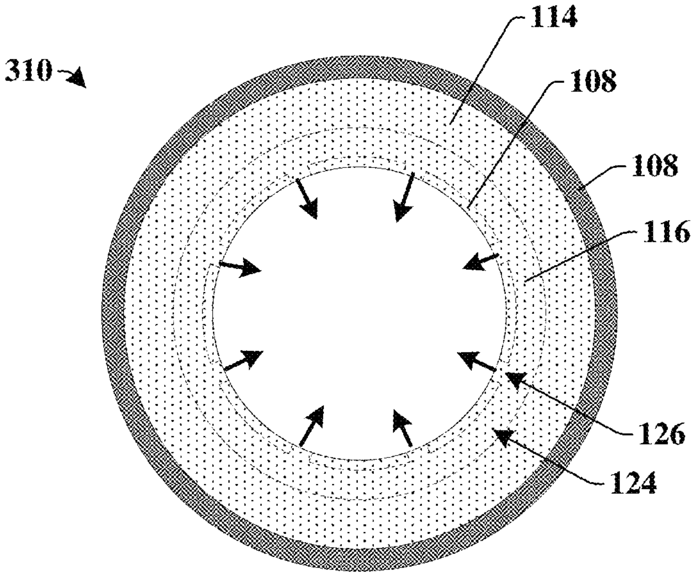

FIG. 3D illustrates some embodiments of a top-view 310 taken along cross-sectional line C-C of FIG. 3A.

As shown in top-view 310, the upper ring 116 extends in a closed loop around the central region of the shielding inset 108. The upper ring 116 covers the upper channel 124 and the plurality of gas vents 126. In some embodiments, the upper ring 116 extends past the lower ring 114 towards a center of the upper ring 116. In such embodiments, the upper ring 116 overhangs the lower ring 114 by a non-zero distance that is directly over the upper channel 124 and the plurality of gas vents 126.

Figure 4A:
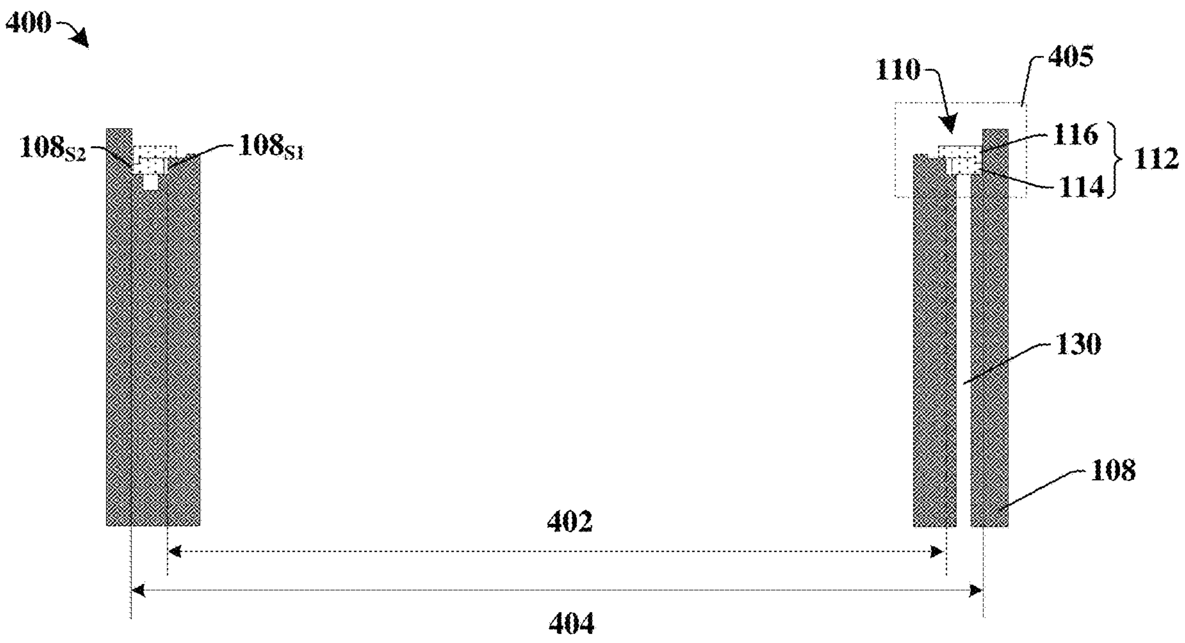
FIGS. 4A-4D illustrate some additional embodiments of a gas distribution ring arranged within a shielding inset.

FIG. 4A illustrates a cross-sectional view 400 of some additional embodiments of the disclosed gas distribution ring within a shield inset.

As shown in cross-sectional view 400, a gas distribution ring 112 is disposed within a groove 110 in an upper surface of a shielding inset 108. A gas pipe 130 vertically extends through the shielding inset 108 to a bottom of the groove 110. The gas distribution ring 112 is disposed within the groove 110 directly between a first sidewall $\mathbf{108}_{S1}$ and a second sidewall $\mathbf{108}_{s2}$ of the shielding inset 108. The first sidewall $\mathbf{108}_{s1}$ has a first diameter 402 and the second sidewall $\mathbf{108}_{s2}$ has a second diameter 404 that is larger than the first diameter 402. In some embodiments, the first diameter 402 may be in a range of between approximately 345 mm and approximately 360 mm, between approximately 345 mm and approximately 350 mm, approximately 348 mm, or other similar values. In some embodiments, the second diameter 404 may be in a range of between approximately 360 mm and approximately 380 mm, between approximately 365 mm and approximately 370 mm, approximately 366 mm, or other similar values.

Figure 4B:
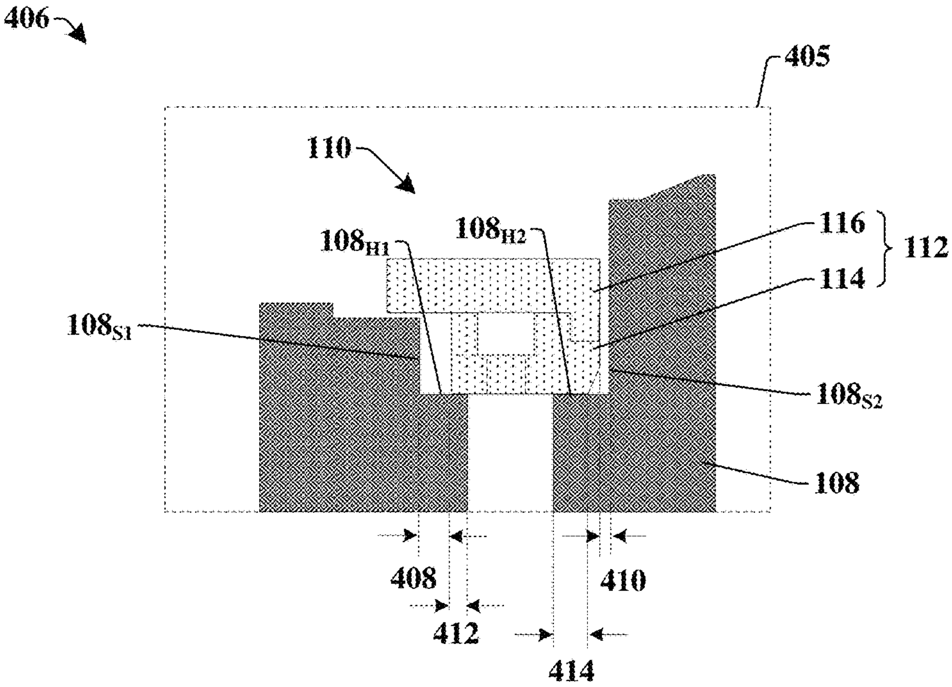

FIG. 4B illustrates a cross-sectional view 406 of some additional embodiments of a region 405 of the disclosed gas distribution ring and shielding inset of FIG. 4A.

As shown in cross-sectional view 406, the gas distribution ring 112 comprises a lower ring 114 and an upper ring 116 over the lower ring 114. The lower ring 114 has sidewalls that are laterally separated from the first sidewall $\mathbf{108}_{s1}$ by a first distance 408 and from the second sidewall $\mathbf{108}_{s2}$ by a second distance 410. The lower ring 114 further comprises a bottom surface that laterally overlaps a first horizontally extending surface 108H1 of the shielding inset 108 by a third distance 412 and that laterally overlaps a second horizontally extending surface 108H2 of the shielding inset 108 by a fourth distance 414.

In some embodiments, the first distance 408 may be in a range of between approximately 1 mm and approximately 2 mm, approximately 1.5 mm, or other similar values. In some embodiments, the second distance 410 may be in a range of between approximately 0.1 mm and approximately 1 mm, approximately 0.5 mm, or other similar values. In some embodiments, the third distance 412 may be in a range of between approximately 1 mm and approximately 2 mm, approximately 1.3 mm, or other similar values. In some embodiments, the fourth distance 414 may be in a range of between approximately 1 mm and approximately 2 mm, approximately 1.6 mm, or other similar values.

Figure 4C:
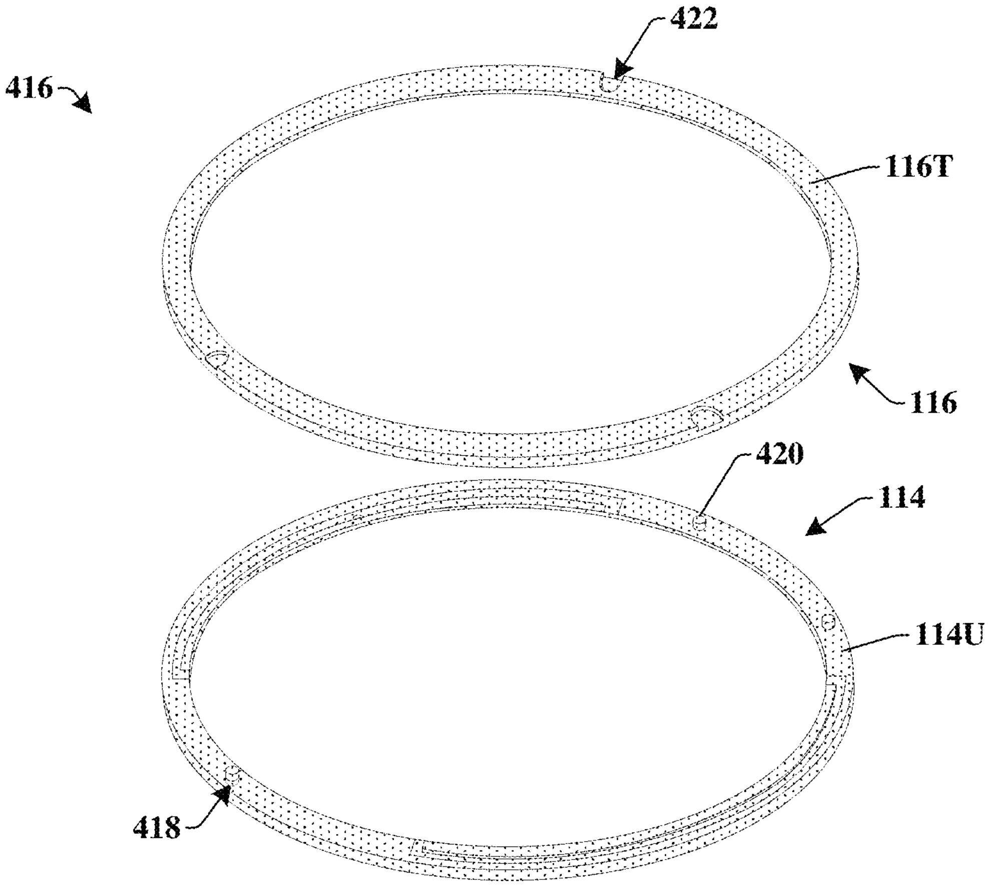

FIG. 4C illustrates a three-dimensional view 416 of the gas distribution ring shown in FIG. 4B. In three-dimensional view 416, the lower ring 114 and the upper ring 116 are illustrated as being vertically separated from one another so to better illustrate features of the lower ring 114. However, as shown in FIG. 4B, the lower ring 114 and the upper ring 116 contact one another in the disclosed gas distribution ring 112.

The lower ring 114 comprises one or more alignment pegs 420 disposed within one or more lower peg holes 418 arranged within the upper surface 114U of the lower ring 114. The one or more lower peg holes 418 comprise recesses that extend into the upper surface 114U of the lower ring 114. The one or more lower peg holes 418 extend to a depth that is less than a height of the lower ring 114. The one or more alignment pegs 420 extend outward from the one or more lower peg holes 418 and into one or more upper peg holes (not shown) arranged along a lower surface of the upper ring 116.

One or more alignment recesses 422 are arranged within a top surface 116T of the upper ring 116. The one or more alignment recesses 422 comprise recesses within the top surface 116T of the upper ring 116. The one or more alignment recesses 422 can be used to ensure that the gas distribution ring 112 is properly aligned with respect to a gas pipe (e.g., 130 of FIG. 4A) so as to ensure a substantially uniform deposition of a process gas from disclosed gas vents.

Figure 4D:
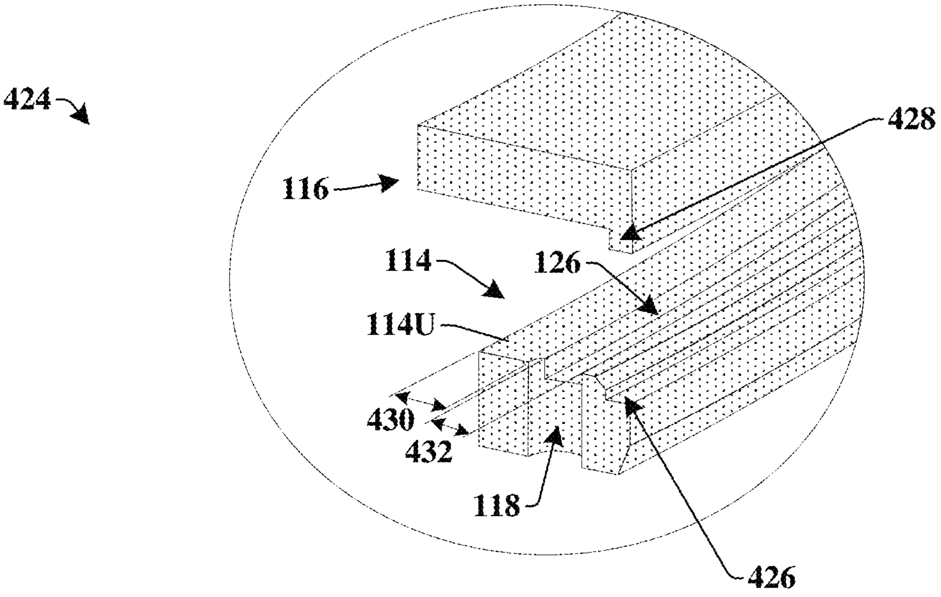

FIG. 4D illustrates a three-dimensional view 424 of a cross-section of the gas distribution ring shown in FIG. 4C.

As shown in three-dimensional view 424, the lower ring 114 comprises a recess 426 disposed along an upper outermost sidewall of the lower ring 114. The upper ring 116 comprises a protrusion 428 that is configured to extend into the recess 426. The protrusion 428 laterally abuts a sidewall of the lower ring 114 defining the recess 426. In some embodiments, the upper ring 116 comprises an “L” shape as viewed along the cross-section of the upper ring 116. The upper ring 116 is configured to rest on the upper surface 114U of the lower ring 114. In some embodiments, the upper surface 114U may have a width 430 between the gas conveyance channel 120 and an inner edge of the lower ring 114. In some embodiments, the width 430 may be in a range of between approximately 2 mm and approximately 3 mm, approximately 2.5 mm, or other similar values.

A gas inlet 118 extends through the lower ring 114 to a bottom of the gas conveyance channel 120. The gas conveyance channel 120 has a height that is less than a height of the lower ring 114. In some embodiments the gas inlet 118 may comprise a circular shaped opening. In some embodiments, the circular shaped opening may have a diameter of approximately 2.5 mm. In some embodiments, the gas conveyance channel 120 may have width 432 of approximately 2.5 mm. In some embodiments, the gas conveyance channel 120 may have a depth of approximately 1.4 mm.

Figure 5:
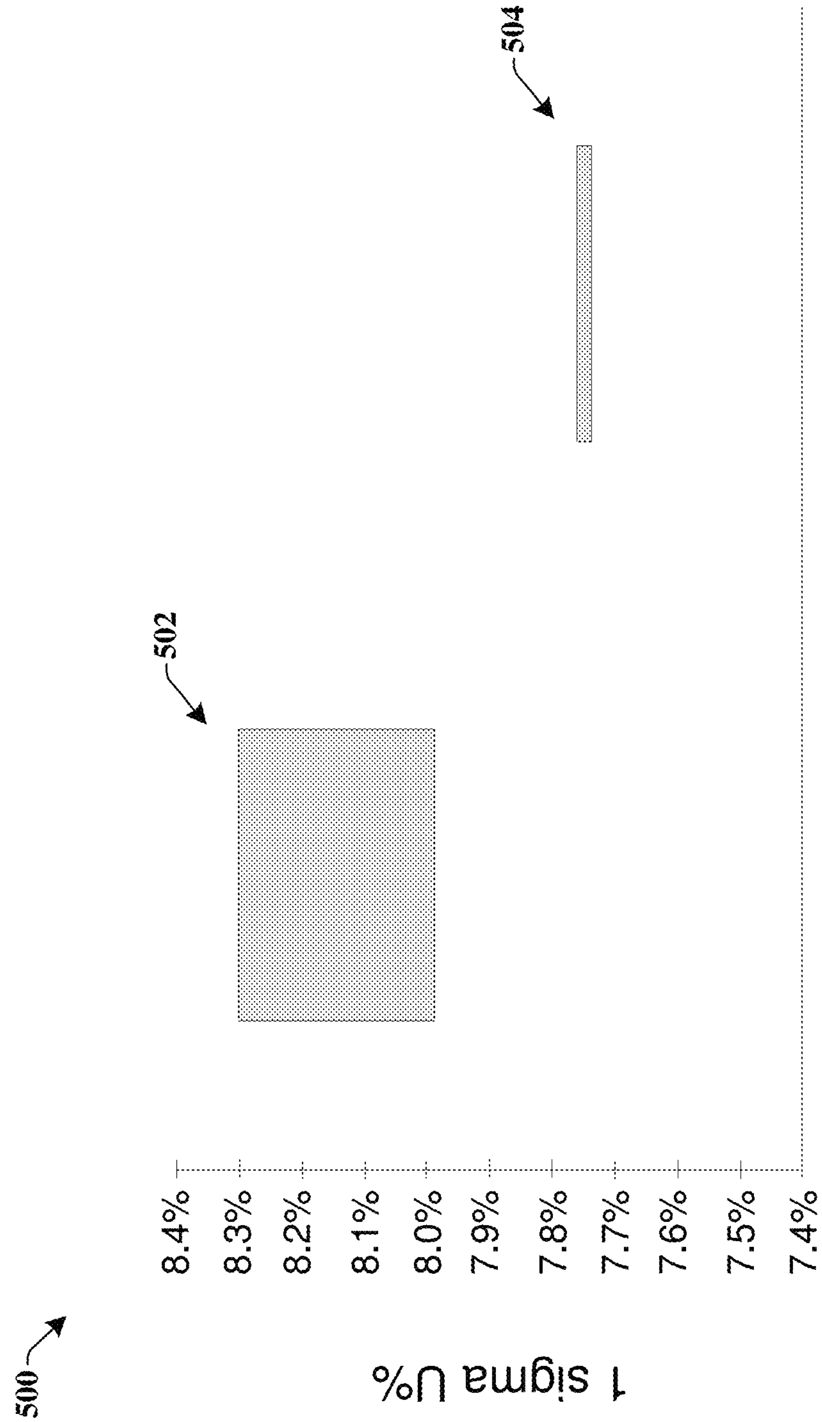
FIG. 5 illustrates a graph showing exemplary one sigma variations of deposited films.

FIG. 5 illustrates a graph 500 showing exemplary one sigma variations of deposited films.

Graph 500 illustrates a first one sigma distribution 502 of a first film deposited using a deposition process within a process chamber having a shielding inset and a gas distribution ring without the gas distribution channels. Such a shielding inset may have five gas vents that are arranged at different path lengths from a gas pipe. The first one sigma distribution 502 may be between approximately 8% and approximately 8.3%. Graph 500 further illustrates a second one sigma distribution 504 of a second film deposited using a deposition process within a process chamber having a disclosed shielding inset and gas distribution ring. Such a shielding inset may comprise eight gas vents that are arranged at substantially equal path lengths from a gas pipe. The second one sigma distribution 504 may be less than approximately 7.7%. Therefore, because the disclosed gas distribution ring provides for a more uniform gas flow around a process chamber, the disclosed gas distribution ring can reduce the one sigma value of a deposited film by a range of between approximately 3% and approximately 7%, in one example.

It has also been appreciated that the additional gas vents of the disclosed shielding inset do not substantially impact a pressure within a process chamber or a deposition rate of a deposition process. For example, for an air flow of approximately 100 sccm (standard cubic centimeters per minute) the pressure achieved by the disclosed shielding inset and gas distribution ring is within a range of between approximately 4% and approximately 8% of that of a shielding inset having five gas vents. Similarly, a deposition rate achieved by the disclosed shielding inset and gas distribution ring may be within a range of between approximately 1% and approximately 2% of that of a shielding inset having five gas vents, in some examples.

Figure 6:
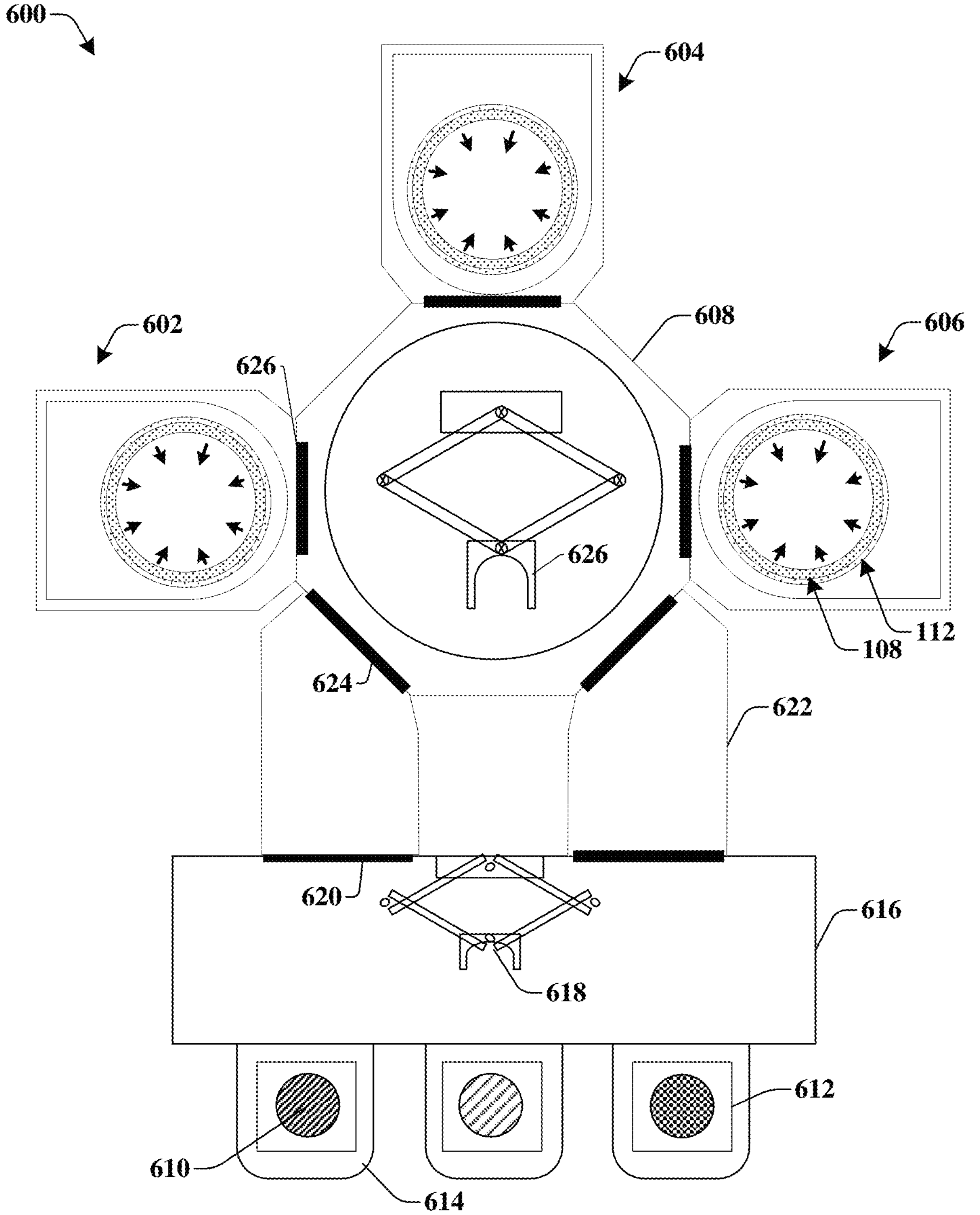
FIG. 6 illustrate some embodiments of a processing tool having a plurality of process chambers respectively comprising a gas distribution ring arranged within a shielding inset.

FIG. 6 illustrates some additional embodiments of a processing tool 600 having process chambers respectively comprising a gas distribution ring arranged within a shielding inset.

The processing tool 600 comprises a plurality of process chambers 602, 604, and 606 coupled to a shared housing assembly 608. In some embodiments, the process chambers 602, 604, and 606 may be held at a first pressure and the shared housing assembly 608 may be held at a second pressure. The first pressure is less than the second pressure and the second pressure is lower than an ambient pressure of an ambient environment. In some embodiments, the first pressure may be in a range of between approximately $1\times10^{-12}$ Torr and approximately $1\times10^{-9}$ Torr, while the second pressure may be in a range of between approximately $1\times10^{-3}$ Torr and approximately 25 Torr. The plurality of process chambers 602, 604, and 606 respectively comprise a shielding inset 108 arranged along a perimeter of a respective process chamber. A disclosed gas distribution ring 112 is arranged within the shielding inset 108.

In some embodiments, the semiconductor workpieces may be disposed within a wafer carrier 612 that is provided to a loading port 614. The wafer carrier 612 is opened and a front-end transfer robot 618, which is disposed within a housing of a front-end interface 616, then removes the semiconductor workpieces 610 from the opened wafer carrier 612. The front-end transfer robot 618 moves the semiconductor workpieces 610 through outer load lock portal 620 and into transfer load lock 622. After the semiconductor workpieces 610 have been loaded into the transfer load lock 622, the outer load lock portal 620 is closed. The transfer load lock 622 is then pumped down to vacuum. The inner load lock portal 624 is then opened, and the semiconductor workpieces 610 are then picked up by the first transfer robot 626. The first transfer robot 626 can move the wafers to the process chambers 602, 604, and 606.

FIGS. 7-14 illustrate cross-sectional views 700-1400 showing some embodiments of a method of forming a forming a gas distribution ring and shielding inset for a processing chamber. Although FIG. 7-14 are described in relation to a method, it will be appreciated that the structures disclosed in FIG. 7-14 are not limited to such a method, but instead may stand alone as structures independent of the method.

Figure 7:
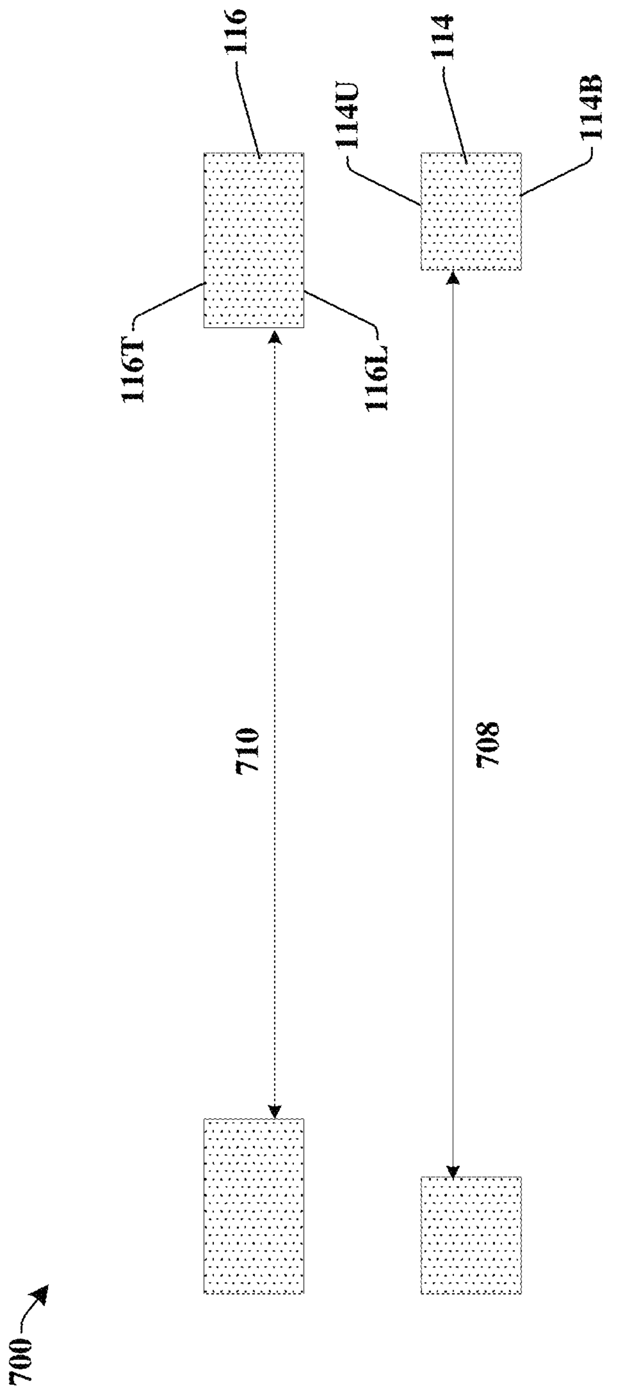
FIGS. 7-14 illustrate some embodiments of a method of forming a gas distribution ring and shielding inset for a processing chamber.

As shown in cross-sectional view 700 of FIG. 7, a lower ring 114 and an upper ring 116 are provided. In some embodiments, the lower ring 114 and the upper ring 116 may comprise or be a ceramic (e.g., alumina, yttria, or the like). In some embodiments, the lower ring 114 has a first diameter 708 extending between one or more interior sidewalls of the lower ring 114 that face one another and the upper ring 116 has a second diameter 710 extending between one or more interior sidewalls of the upper ring 116 that face one another. The first diameter 708 is larger than the second diameter 710. The lower ring 114 comprises a bottom surface 114B and an upper surface 114U. The upper ring 116 comprises a lower surface 116L and a top surface 116T.

Figure 8A:
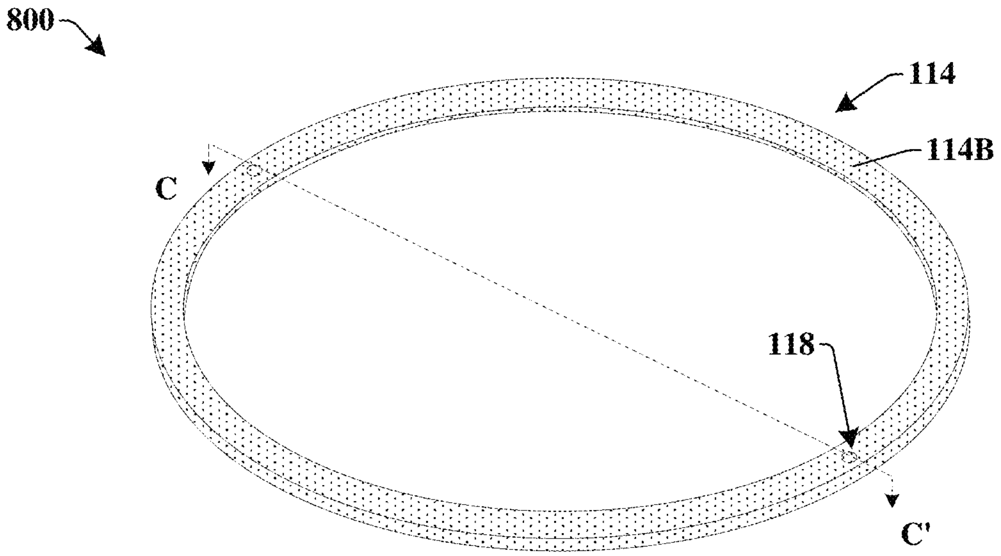
Figure 8B:

As shown in and three-dimensional view 800 of FIG. 8A and cross-sectional view 802 of FIG. 8B (taken along cross-sectional line A-A'), a plurality of gas inlets 118 are formed within the bottom surface 114B of the lower ring 114. In some embodiments, the plurality of gas inlets 118 may be formed to extend completely through the lower ring 114. In other embodiments (not shown), the plurality of gas inlets 118 may be formed to extend through a part, but not all, of the lower ring 114. In some embodiments, the plurality of gas inlets 118 may comprise circular holes formed by mechanical drilling, laser drilling, or the like. In some embodiments, the plurality of gas inlets 118 may comprise or be two gas inlet holes formed on opposing sides of the lower ring 114. In some embodiments, the plurality of gas inlets 118 may be formed to be centered at positions that are approximately 180° apart from one another as measured along a circle concentric with the lower ring 114.

Figure 9A:
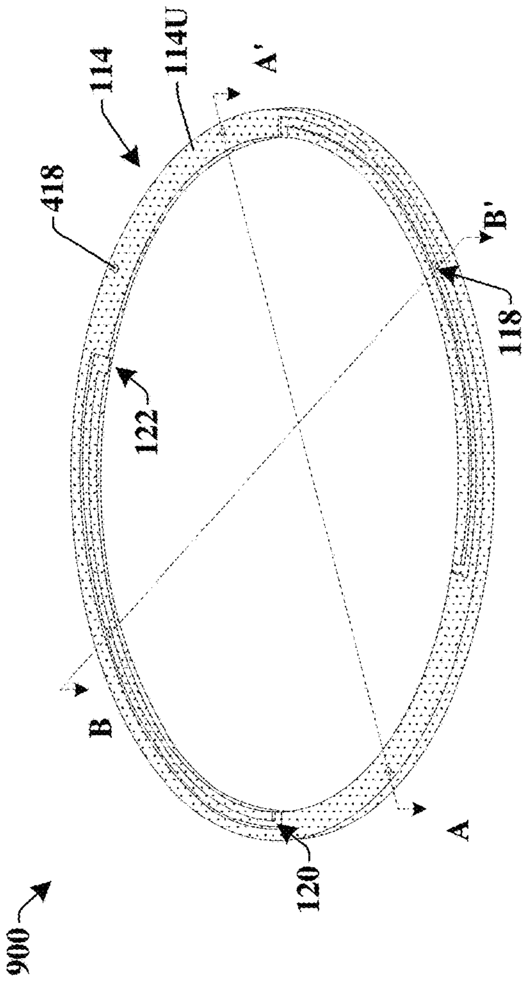
Figure 9B:

As shown in three-dimensional view 900 of FIG. 9A and cross-sectional view 904 of FIG. 9B (taken along cross-sectional line A-A'), a plurality of gas conveyance channels 120 are formed within the upper surface 114U of the lower ring 114. The plurality of gas conveyance channels 120 are formed directly over the plurality of gas inlets 118. The plurality of gas conveyance channels 120 and the plurality of gas inlets 118 collectively extend completely through the lower ring 114. The plurality of gas conveyance channels 120 extend between a plurality of gas outlets 122 formed within one or more interior sidewalls of the lower ring 114.

In some embodiments, the plurality of gas conveyance channels 120 may be formed by mechanical drilling, laser drilling, or the like. In some embodiments, the plurality of gas conveyance channels 120 may be formed to be respectively centered upon one of the plurality of gas inlets 118, as measured along circle that is concentric with the lower ring 114. In such embodiments, the plurality of gas conveyance channels 120 extend to substantially equal distances past the plurality of gas inlets 118.

Figure 9C:
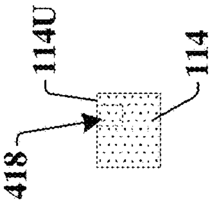

In some embodiments, shown in three-dimensional view 900 of FIG. 9A and cross-sectional view 906 of FIG. 9C (taken along cross-sectional line B-B'), one or more lower peg holes 418 are formed within the upper surface 114U of the lower ring 114. The one or more lower peg holes 418 comprise recesses that extend into the upper surface 114U of the lower ring 114. The one or more lower peg holes 418 extend to a depth that is less than a height of the lower ring 114. In some embodiments, the one or more lower peg holes 418 may be formed by mechanical drilling, laser drilling, or the like.

Figure 10A:
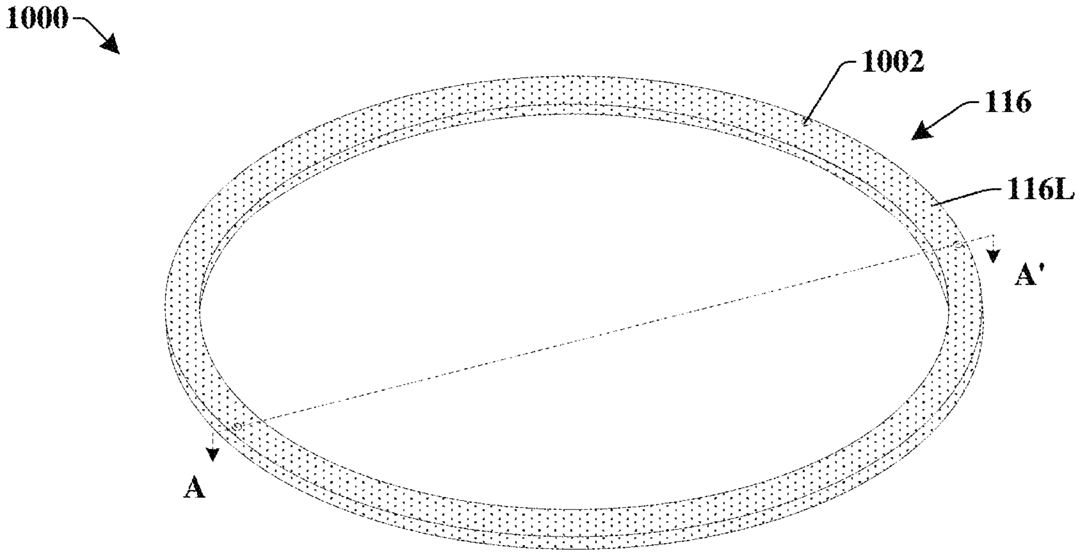
Figure 10B:

As shown in three-dimensional view 1000 of FIG. 10A and cross-sectional view 1004 of FIG. 10B (taken along cross-sectional line A-A'), one or more upper peg holes 1002 are formed within the lower surface 116L of the upper ring 116. The one or more upper peg holes 1002 comprise recesses that extend into the lower surface 116L of the upper ring 116. The one or more upper peg holes 1002 extend to a depth that is less than a height of the upper ring 116. In some embodiments, the one or more upper peg holes 1002 may be formed by mechanical drilling, laser drilling, or the like.

Figure 11A:
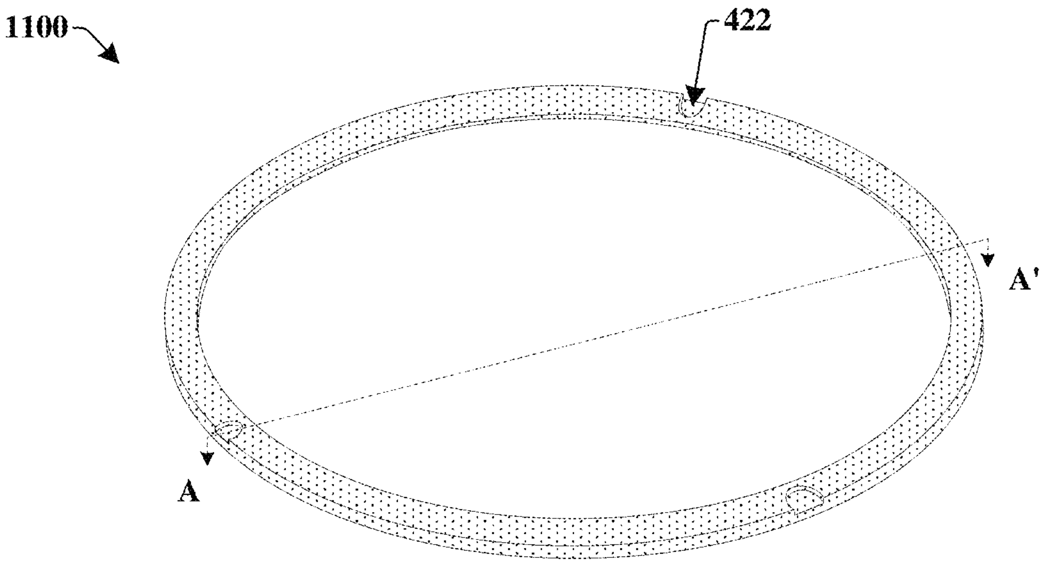
Figure 11B:

As shown in three-dimensional view 1100 of FIG. 11A and cross-sectional view 1104 of FIG. 11B (taken along cross-sectional line A-A'), one or more alignment recesses 422 are formed within the top surface 116T of the upper ring 116. The one or more alignment recesses 422 comprise recesses within the top surface 116T of the upper ring 116. The one or more alignment recesses 422 extend to a depth that is less than a height of the upper ring 116. In some embodiments, the one or more alignment recesses 422 may be formed by mechanical drilling, laser drilling, or the like.

Figure 12A:
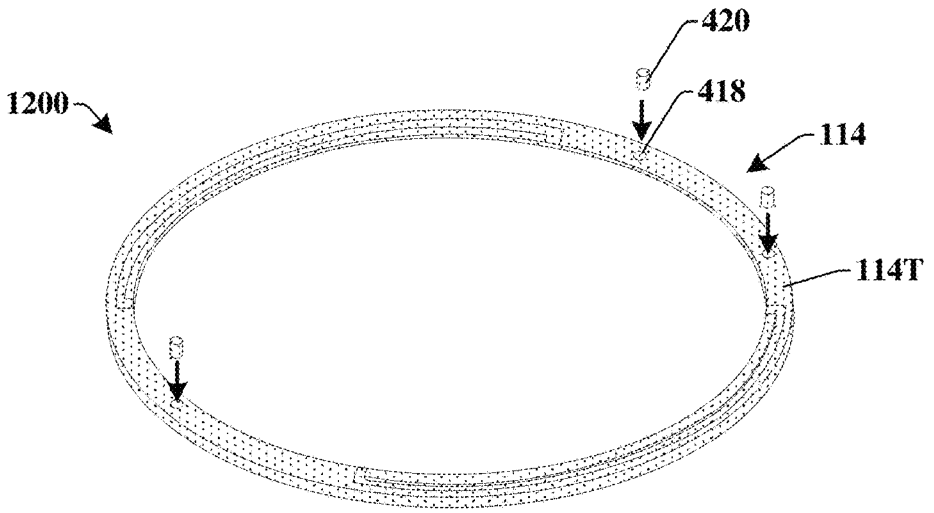

As shown in three-dimensional view 1200 of FIG. 12A, one or more alignment pegs 420 are placed within the one or more lower peg holes 418. In some embodiments, an adhesive may be placed on the one or more alignment pegs 420 and/or within the one or more lower peg holes 418 prior to placing the one or more alignment pegs 420 within the one or more lower peg holes 418. The adhesive bonds the one or more alignment pegs 420 to the lower ring 114.

Figure 12B:
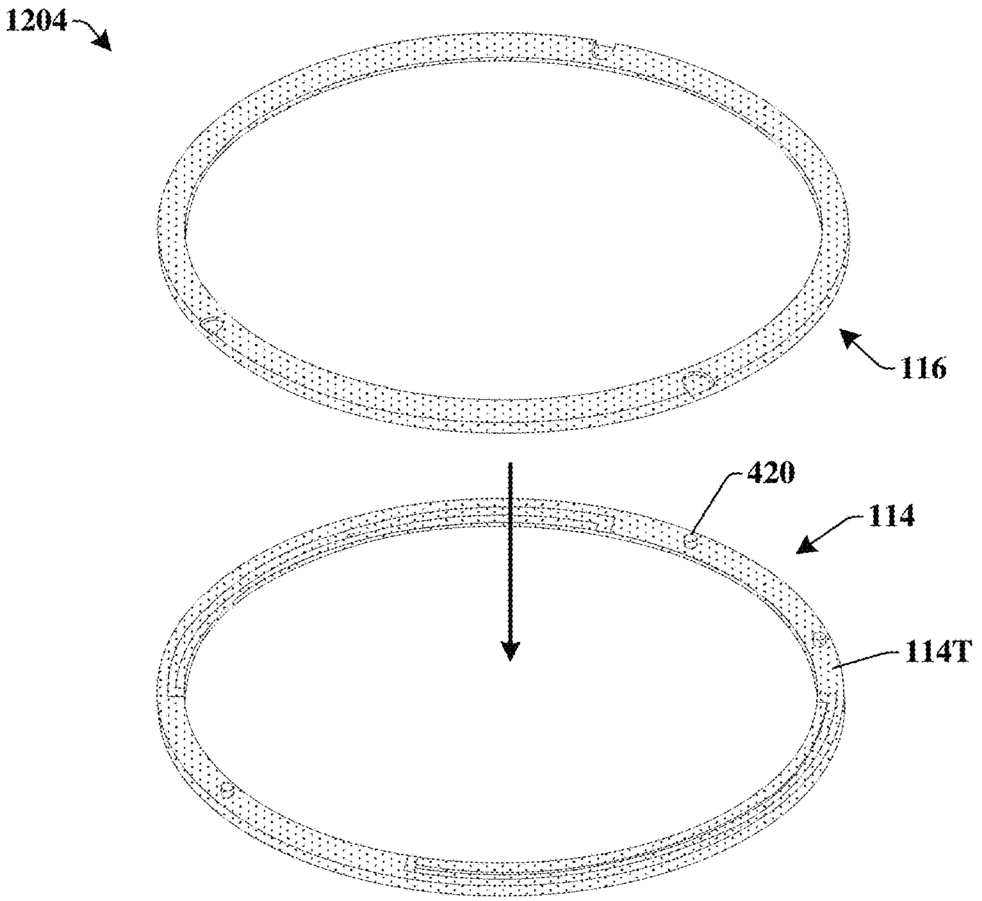

As shown in three-dimensional view 1204 of FIG. 12B, the upper ring 116 is bonded to the lower ring 114 so that the one or more alignment pegs 420 enter into the one or more upper peg holes. In some embodiments, an adhesive may be placed on the one or more alignment pegs 420 and/or within the one or more upper peg holes prior to placing the one or more alignment pegs 420 within the one or more upper peg holes. The adhesive bonds the one or more alignment pegs 420 to the upper ring 116.

Figure 12C:
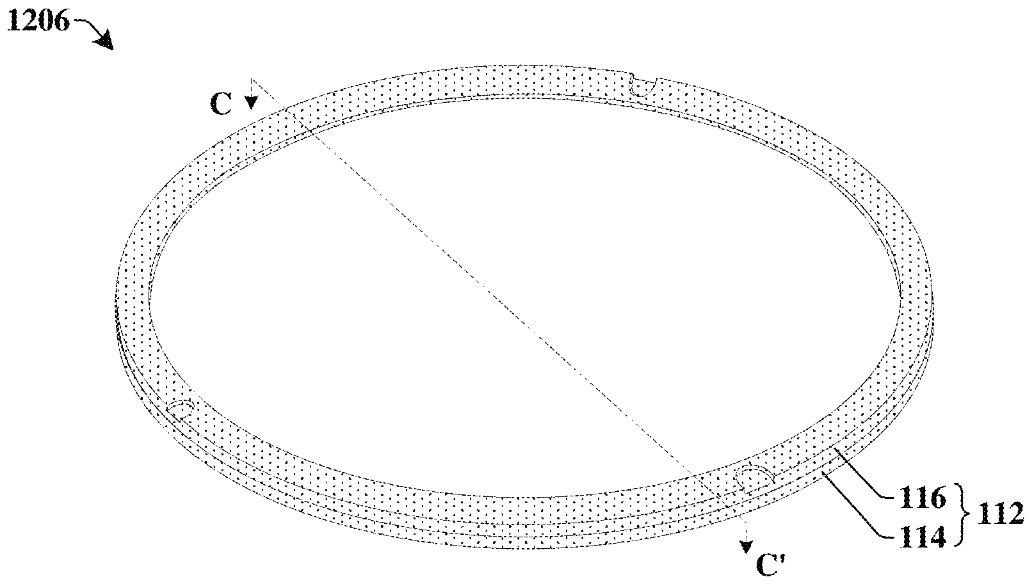
Figure 12D:
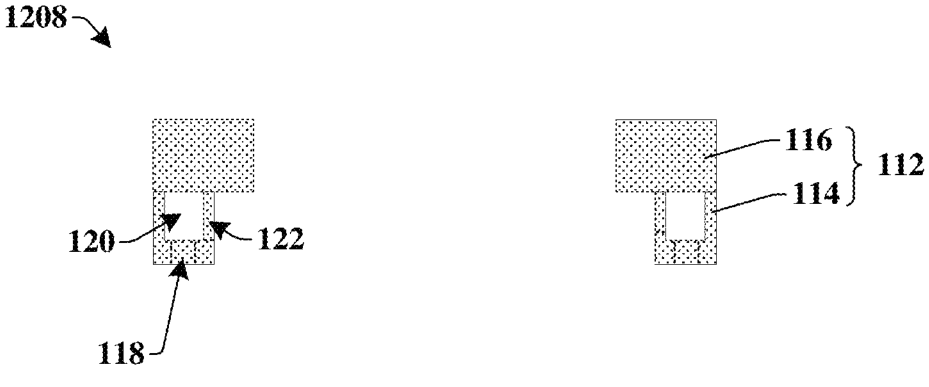

FIG. 12C illustrates a three-dimensional view 1206 of the gas distribution ring 112 after the bonding process is complete. FIG. 12D illustrates a cross-sectional view 1208 (taken along line A-A') of the gas distribution ring 112 after the bonding process is complete. In some embodiments, the lower ring 114 may be bonded to the upper ring 116 at a temperature that is greater than approximately 300° C., greater than approximately 400° C., approximately 400° C., or other similar values.

Figure 13:
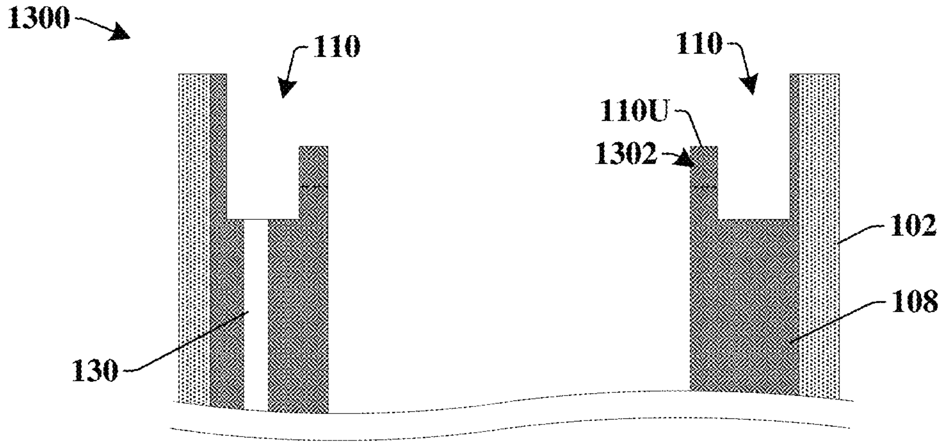

As shown in cross-sectional view 1300 of FIG. 13, a shielding inset 108 is placed within a process chamber 101. The shielding inset 108 comprises a cylindrical shaped tube that covers sidewalls of the process chamber 101. The shielding inset 108 comprises a groove 110 arranged within an upper surface of the shielding inset 108. The groove 110 is defined by sidewalls and horizontally extending surfaces of the shielding inset 108. The groove 110 is in communication with a gas pipe 130 that is configured to provide a process gas to the process chamber 101. In some embodiments, a plurality of notches 1302 (e.g., depressions) may be arranged within an upper surface 108U of the shielding inset 108. The plurality of notches 1302 extend between interior sidewalls of the shielding inset 108 and the groove 110. The plurality of notches 1302 are even spaced apart from one another. In some embodiments, the plurality of notches 1302 may comprise or be eight notches.

Figure 14:
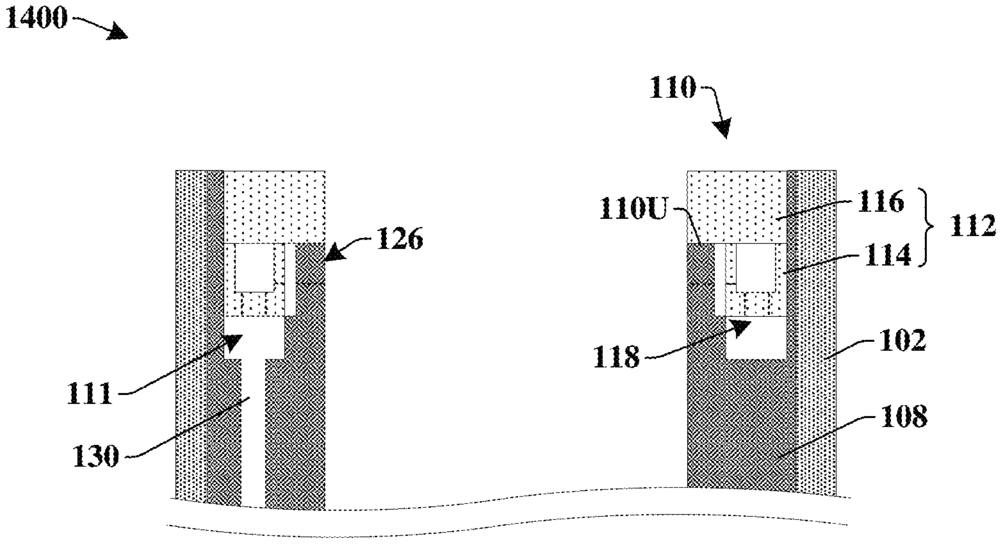

As shown in cross-sectional view 1400 of FIG. 14, the gas distribution ring 112 is placed within a groove 110 in a shielding inset 108. The lower ring 114 of the gas distribution ring 112 is placed to rest on horizontally extending surfaces of the shielding inset 108, so as to form a lower channel 111 that extends within the shielding inset 108 below the gas distribution ring 112. The upper ring 116 of the gas distribution ring 112 is configured to rest on the upper surface 108U of the shielding inset 108 so as to form a plurality of gas vents 126 connecting the groove 110 and a central region of the shielding inset 108. In some embodiments, the gas distribution ring 112 is oriented within the shielding inset 108 according to the one or more alignment recesses 422 so that the plurality of gas inlets 118 of the gas distribution ring 112 are separated from the gas pipe 130 by approximately equal distances. In some additional embodiments, the shielding inset 108 may be oriented within the process chamber 101 according to the one or more alignment recesses 422 so that the plurality of gas inlets are separated from the gas pipe 130 by approximately equal distances.

Figure 15:
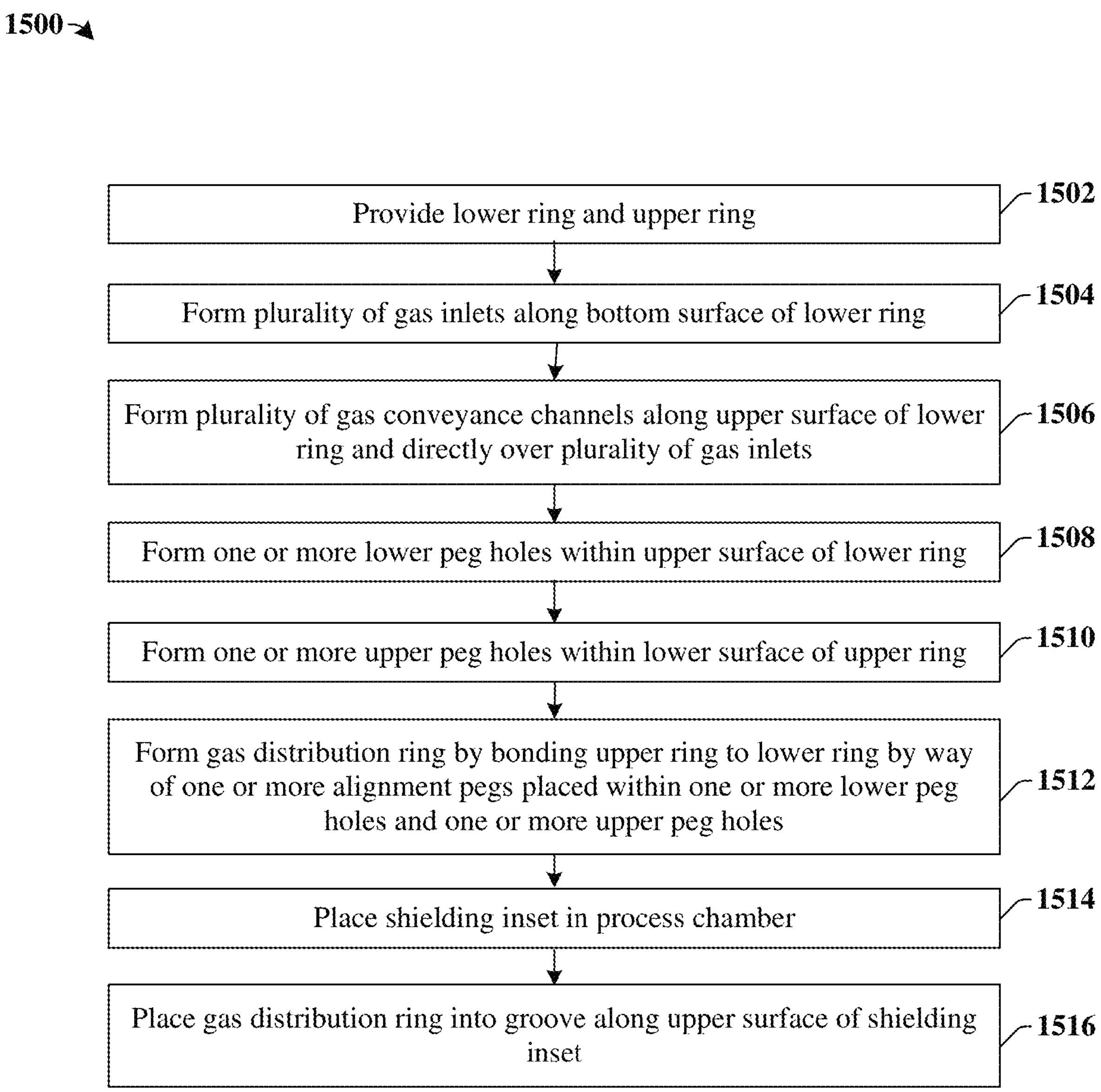
FIG. 15 illustrates a flow diagram of some embodiments of a method of forming a gas distribution ring and shielding inset for a processing chamber.

FIG. 15 illustrates a flow diagram of some embodiments of a method 1500 of forming a gas distribution ring and shielding inset for a processing chamber.

While method 1500 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1502, a lower ring and an upper ring are provided. FIG. 7 illustrates a cross-sectional view 700 of some embodiments corresponding to act 1502.

At act 1504, a plurality of gas inlets are formed along a bottom surface of the lower ring. FIGS. 8A-8B illustrate some embodiments corresponding to act 1504.

At act 1506, a plurality of gas conveyance channels are formed along an upper surface of the lower ring. The plurality of gas conveyance channels are formed directly over the plurality of gas inlets. FIGS. 9A-9B illustrate some embodiments corresponding to act 1506.

At act 1508, one or more lower peg holes are formed along the upper surface of the lower ring. FIGS. 9A and 9C illustrate some embodiments corresponding to act 1508.

At act 1510, one or more upper peg holes are formed along a lower surface of the top ring. FIGS. 10A and 10C illustrate some embodiments corresponding to act 1510.

At act 1512, a gas distribution ring is formed by bonding the upper ring to the lower ring by way of one or more alignment pegs placed within the one or more lower peg holes and the one or more upper peg holes. FIGS. 12A-12D illustrate some embodiments corresponding to act 1512.

At act 1514, a shielding inset is placed within a process chamber. FIG. 13 illustrates a cross-sectional view 1300 of some embodiments corresponding to act 1514.

At act 1516, the gas distribution ring is placed within a groove along a top of the shielding inset. FIG. 14 illustrates a cross-sectional view 1400 of some embodiments corresponding to act 1516.

Accordingly, in some embodiments, the present disclosure relates to a shielding inset and a gas distribution ring for a process chamber. The gas distribution ring comprises a plurality of gas conveyance channels that extend through the gas distribution ringand that are configured to provide a plurality of gas conveyance paths between a gap pipe and gas vents in communication with a central region of the process chamber. The plurality of gas conveyance paths have substantially equal lengths that provide for substantially equal gas flow rates at the gas vents.

In some embodiments, the present disclosure relates to an integrated chip processing tool. The integrated chip processing tool includes a gas distribution ring configured to extend along a perimeter of a process chamber; the gas distribution ring including a lower ring extending around the process chamber, the lower ring having a plurality of gas inlets arranged along a bottom surface of the lower ring and a plurality of gas conveyance channels arranged along an upper surface of the lower ring directly over the plurality of gas inlets; an upper ring disposed on the upper surface of the lower ring and covering the plurality of gas conveyance channels, a plurality of gas outlets being arranged along opposing ends of the plurality of gas conveyance channels; and a plurality of gas conveyance paths extending between the plurality of gas inlets and the plurality of gas outlets have approximately equal lengths. In some embodiments, the plurality of gas conveyance channels respectively extend over an angle that is in a range of between approximately 90° and approximately 100° as measured along a circle that is concentric with the lower ring. In some embodiments, the plurality of gas outlets are arranged within one or more interior sidewalls of the lower ring. In some embodiments, the plurality of gas inlets respectively include a circular opening that extends from the bottom surface of the lower ring, through the lower ring, and to a bottom of one of the plurality of gas conveyance channels. In some embodiments, the lower ring has one or more interior sidewalls that are arranged at a first diameter and the upper ring has one or more interior sidewalls that are arranged at a second diameter, the second diameter being smaller than the first diameter. In some embodiments, the plurality of gas conveyance channels include a first gas conveyance channel and a second gas conveyance channel separated from one another by a part of the lower ring. In some embodiments, the upper ring continuously extends in a closed loop. In some embodiments, the gas distribution ring includes a ceramic.

In other embodiments, the present disclosure relates to an integrated chip processing tool. The integrated chip processing tool includes a process chamber having a housing configured to receive a substrate; a shielding inset including a tube that is arranged along sidewalls of the housing, the shielding inset having surfaces defining a groove disposed along an upper surface of the shielding inset; a gas distribution ring disposed within the groove and including: a lower ring having a plurality of gas inlets extending between a bottom surface of the lower ring and a plurality of gas conveyance channels arranged along an upper surface of the lower ring, a plurality of gas outlets being arranged at opposing ends of respective ones of the plurality of the gas conveyance channels; and an upper ring having a lower surface configured to contact the upper surface of the lower ring and a horizontally extending surface of the shielding inset, a plurality of gas vents being arranged between the horizontally extending surface of the shielding inset and the upper ring. In some embodiments, the plurality of gas vents are spaced along a sidewall of the shielding inset at substantially equal distances. In some embodiments, the plurality of gas vents are defined by sidewalls of the shielding inset and by the lower surface of the upper ring. In some embodiments, the plurality of gas vents are separated from one another by an angle of approximately 45° as measured along a circle concentric with the shielding inset. In some embodiments, two of the plurality of gas vents are separated from a gas outlet of the plurality of gas outlets by an angle of approximately 22.5° as measured along a circle concentric with the shielding inset. In some embodiments, the plurality of gas vents include eight gas vents spaced along a sidewall of the shielding inset at substantially equal distances. In some embodiments, the lower ring has two gas inlets disposed along the bottom surface of the lower ring and two gas conveyance channels disposed directly over the two gas inlets; four gas outlets being disposed on opposing ends of the two gas conveyance channels.

In yet other embodiments, the present disclosure relates to a method for forming an integrated chip processing tool. The method includes providing an upper ring and a lower ring; forming a plurality of gas inlets within a bottom surface of the lower ring; forming a plurality of gas conveyance channels within an upper surface of the lower ring and directly over the plurality of gas inlets, the plurality of gas conveyance channels terminating at a plurality of gas outlets disposed at opposing ends of the plurality of gas conveyance channels; and bonding a lower surface of the upper ring to the upper surface of the lower ring. In some embodiments, the lower ring has a first diameter extending between one or more interior sidewalls of the lower ring that face one another; and the upper ring has a second diameter extending between one or more interior sidewalls of the upper ring that face one another, the second diameter being smaller than the first diameter. In some embodiments, the plurality of gas inlets are separated by an angle of approximately 180° as measured along a circle concentric with the lower ring; and a first gas outlet and a second gas outlet are disposed at opposing ends of a first gas conveyance channel over a first gas inlet, the first gas outlet and the second gas outlet being separated from the first gas inlet by approximately equal distances. In some embodiments, the method further includes forming one or more lower peg holes within the upper surface of the lower ring; forming one or more upper peg holes within the lower surface of the upper ring; providing one or more alignment pegs within the one or more lower peg holes; and bringing the upper ring into contact with the lower ring so that the one or more alignment pegs extend into the one or more upper peg holes. In some embodiments, the method further includes placing a shielding inset into a process chamber, the shielding inset extending around a perimeter of the process chamber to cover one or more interior sidewalls of the process chamber; and placing the gas distribution ring into a groove along an upper surface of the shielding inset.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip processing tool, comprising:

a gas distribution ring configured to extend along a perimeter of a process chamber and comprising:

a lower ring extending around the process chamber, wherein the lower ring comprises a plurality of gas inlets arranged along a bottom surface of the lower ring and a plurality of gas conveyance channels arranged along an upper surface of the lower ring directly over the plurality of gas inlets;

an upper ring disposed on the upper surface of the lower ring and covering the plurality of gas conveyance channels, wherein a plurality of gas outlets are arranged along opposing ends of the plurality of gas conveyance channels and within one or more interior sidewalls of the lower ring; and wherein a plurality of gas conveyance paths extending between the plurality of gas inlets and the plurality of gas outlets have approximately equal lengths.

2. The integrated chip processing tool of claim 1, wherein the plurality of gas conveyance channels respectively extend over an angle that is in a range of between approximately 90° and approximately 100° as measured along a circle that is concentric with the lower ring.

3. The integrated chip processing tool of claim 1, wherein the plurality of gas inlets respectively comprise a circular opening that extends from the bottom surface of the lower ring, through the lower ring, and to a bottom of one of the plurality of gas conveyance channels.

4. The integrated chip processing tool of claim 1, wherein the one or more interior sidewalls of the lower ring are arranged at a first diameter and the upper ring has one or more interior sidewalls that are arranged at a second diameter, the second diameter being smaller than the first diameter.

5. The integrated chip processing tool of claim 1, wherein the plurality of gas conveyance channels comprise a first gas conveyance channel and a second gas conveyance channel separated from one another by a part of the lower ring.

6. The integrated chip processing tool of claim 1, wherein the upper ring continuously extends in a closed loop.

7. The integrated chip processing tool of claim 1, wherein the gas distribution ring comprises a ceramic.

8. The integrated chip processing tool of claim 1, wherein a lower surface of the upper ring laterally extends towards a center of the lower ring for a non-zero distance past the one or more interior sidewalls.

9. An integrated chip processing tool, comprising:

a process chamber having a housing configured to receive a substrate;

a shielding inset comprising a tube that is arranged along sidewalls of the housing, wherein the shielding inset has surfaces defining a groove disposed along an upper surface of the shielding inset;

a gas distribution ring disposed within the groove and comprising:

a lower ring having a plurality of gas inlets extending between a bottom surface of the lower ring and a plurality of gas conveyance channels arranged along an upper surface of the lower ring, wherein a plurality of gas outlets are arranged at opposing ends of respective ones of the plurality of gas conveyance channels; and an upper ring having a lower surface configured to contact the upper surface of the lower ring and a horizontally extending surface of the shielding inset, wherein a plurality of gas vents are arranged between the horizontally extending surface of the shielding inset and the upper ring.

10. The integrated chip processing tool of claim 9, wherein the plurality of gas vents are spaced along a sidewall of the shielding inset at substantially equal distances.

11. The integrated chip processing tool of claim 9, wherein the plurality of gas vents are defined by sidewalls of the shielding inset and by the lower surface of the upper ring.

12. The integrated chip processing tool of claim 9, wherein the plurality of gas vents are separated from one another by an angle of approximately 45° as measured along a circle concentric with the shielding inset.

13. The integrated chip processing tool of claim 9, wherein two of the plurality of gas vents are separated from a gas outlet of the plurality of gas outlets by an angle of approximately 22.5° as measured along a circle concentric with the shielding inset.

14. The integrated chip processing tool of claim 9, wherein the plurality of gas vents comprise eight gas vents spaced along a sidewall of the shielding inset at substantially equal distances.

15. The integrated chip processing tool of claim 9, wherein the lower ring comprises two gas inlets disposed along the bottom surface of the lower ring and two gas conveyance channels disposed directly over the two gas inlets; and wherein four gas outlets are disposed on opposing ends of the two gas conveyance channels.

16. A gas distribution ring, comprising:

a lower ring, comprising:

interior sidewalls that form a pair of gas conveyance channels within an upper surface of the lower ring, wherein the pair of gas conveyance channels are symmetric about a line bisecting the lower ring and respectively extend between gas outlets that are within an innermost sidewall of the lower ring; and a pair of gas inlets, which respectively comprise an opening vertically extending from a bottommost surface of the lower ring to a lower surface of the lower ring that forms one of the pair of gas conveyance channels, wherein distances between the pair of gas inlets and the gas outlets are substantially equal; and an upper ring comprising a lower surface that is configured to contact the upper surface of the lower ring and to cover the pair of gas conveyance channels.

17. The gas distribution ring of claim 16, wherein the lower ring has a first inner diameter and the upper ring has a second inner diameter that is smaller than the first inner diameter.

18. The gas distribution ring of claim 16, wherein the pair of gas inlets are separated by an angle of approximately 180° as measured along a circle concentric with the lower ring.

19. The gas distribution ring of claim 16, wherein the upper ring comprises a protrusion extending outward from the lower surface, the protrusion configured to vertically and laterally contact the lower ring.

20. The gas distribution ring of claim 16, further comprising:

a plurality of lower peg holes arranged within the upper surface of the lower ring;

a plurality of upper peg holes arranged within the lower surface of the upper ring; and a plurality of alignment pegs disposed within the plurality of lower peg holes and the plurality of upper peg holes.

* * * * *